(12) United States Patent
Jiang et al.

(10) Patent No.: US 10,748,739 B2
(45) Date of Patent: Aug. 18, 2020

(54) DEFLECTION ARRAY APPARATUS FOR MULTI-ELECTRON BEAM SYSTEM

(71) Applicant: KLA-Tencor Corporation, Mikpitas, CA (US)

(72) Inventors: Xinrong Jiang, Palo Alto, CA (US); Christopher Sears, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/230,325

(22) Filed: Dec. 21, 2018

(65) Prior Publication Data

US 2020/0118784 A1 Apr. 16, 2020

Related U.S. Application Data

(60) Provisional application No. 62/744,856, filed on Oct. 12, 2018.

(51) Int. Cl.
*H01J 37/12* (2006.01)
*H01J 37/06* (2006.01)

(52) U.S. Cl.
CPC .............. *H01J 37/12* (2013.01); *H01J 37/06* (2013.01); *H01J 2237/06308* (2013.01); *H01J 2237/1202* (2013.01); *H01J 2237/1205* (2013.01)

(58) Field of Classification Search
CPC ...... H01J 37/12; H01J 37/147; H01J 37/1471; H01J 37/1472; H01J 2237/1205
See application file for complete search history.

(56) References Cited

U.S. PATENT DOCUMENTS

| 6,125,522 A * | 10/2000 | Nakasuji | H01J 9/236 29/458 |
|---|---|---|---|
| 8,536,538 B2 | 9/2013 | Jiang | |
| 9,620,329 B1 | 4/2017 | Cook et al. | |
| 2003/0168606 A1* | 9/2003 | Adamec | H01J 37/04 250/396 R |
| 2012/0205537 A1* | 8/2012 | Jiang | H01J 37/147 250/307 |

(Continued)

FOREIGN PATENT DOCUMENTS

WO 2012122036 A2 9/2012

OTHER PUBLICATIONS

Jiang, Xinrong, "Evaluations of MSA, MFA and MDA built-in T1 Micro Einzel Lenses", published on May 11, 2018, 21 pages.

(Continued)

*Primary Examiner* — Eliza W Osenbaugh-Stewart
(74) *Attorney, Agent, or Firm* — Suiter Swantz pc llo

(57) ABSTRACT

An optical characterization system utilizing a micro-lens array (MLA) is provided. The system may include an electron source and a MLA including a micro-deflection array (MDA). The MDA may include an insulator substrate and a plurality of hexapole electrostatic deflectors disposed on the insulator substrate. The MDA may further include a plurality of voltage connecting lines configured to electrically couple the plurality of hexapole electrostatic deflectors to one or more voltage sources. The MDA may be configured to split a primary electron beam from the electron source into a plurality of primary electron beamlets. The system may be configured to focus the plurality of primary electron beamlets at a wafer plane.

36 Claims, 16 Drawing Sheets

(56) References Cited

U.S. PATENT DOCUMENTS

2016/0268096 A1* 9/2016 Ren .................. H01J 37/28
2016/0329189 A1 11/2016 Sears et al.
2017/0148609 A1* 5/2017 Cook ................. H01J 37/147

OTHER PUBLICATIONS

Jiang, Xinrong, "Study of a single-polarity hexapole electrostatic deflector", published on Aug. 25, 2018, 11 pages.
Jiang, Xin-rong et al., "The field solutions for multipole electrostatic deflectors", J. Vac. Sci. Technol. B5(1), Jan./Feb. 1987, pp. 156-160.
International Search Report and Written Opinion dated Feb. 25, 2020 for PCT/US2019/054373.

\* cited by examiner

US 10,748,739 B2

DEFLECTION ARRAY APPARATUS FOR MULTI-ELECTRON BEAM SYSTEM

CROSS-REFERENCE TO RELATED APPLICATION

The present application claims the benefit under 35 U.S.C. § 119(e) of U.S. Provisional Application Ser. No. 62/744,856, filed Oct. 12, 2018, entitled MICRO DEFLECTION ARRAY FOR MULTI ELECTRON BEAM APPARATUS, naming Xinrong Jiang and Chris Sears as inventors, which is incorporated herein by reference in the entirety.

TECHNICAL FIELD

The present invention generally relates to an electron beam system and, more particularly, to an electrostatic deflector apparatus for a multi-electron beam system.

BACKGROUND

Electron beam inspection systems often utilize a micro-lens array (MLA) in order to split primary electron beams into multiple primary electron beamlets. In order to use the primary electron beamlets for scanning, a micro-deflection array (MDA) utilizing electrostatic deflection may be integrated into the micro-lens array. In order to achieve sufficient electrostatic deflection performance, third order deflection aberrations must be eliminated. However, current MDA approaches have proved to be insufficient. Current MDA systems require large numbers of electrostatic deflection plates and/or voltage connecting lines (e.g., power lines), causing them to be bulky, overly complicated, and incompatible for MLA systems for hundreds of primary electron beamlets. Additionally, current MDA approaches which do not require large numbers of electrostatic deflection plates and/or voltage connecting lines do not sufficiently eliminate third order aberrations. Therefore, it would be desirable to provide a system and method that cure one or more of the shortfalls of the previous approaches identified above.

SUMMARY

A system is disclosed, in accordance with one or more embodiments of the present disclosure. In one embodiment, the system includes an electron source. In another embodiment, the system includes a micro-lens array (MLA) configured to receive one or more primary electron beams from the electron source, the micro-lens array including a micro-deflection array (MDA). The micro-deflection array may include a plurality of hexapole electrostatic deflectors configured to split the one or more primary electron beams into a plurality of primary electron beamlets. In another embodiment, the system includes projection optics configured to receive the plurality of primary electron beamlets and focus the plurality of primary electron beamlets onto a surface of a sample.

A micro-deflection array is disclosed, in accordance with one or more embodiments of the present disclosure. In one embodiment, the micro-deflection array includes an insulator substrate. In another embodiment, the micro-deflection array includes a plurality of hexapole electrostatic deflectors disposed on the insulator substrate, wherein each hexapole electrostatic deflector of the plurality of hexapole electrostatic deflectors comprises six deflection plates. In another embodiment, the micro-deflection array includes a plurality of voltage connecting lines disposed on the insulator substrate configured to electrically couple the plurality of hexapole electrostatic deflectors to one or more voltage sources via a plurality of connecting pins, wherein the one or more voltage sources are configured to apply one or more focusing voltages to each hexapole electrostatic deflector of the plurality of hexapole electrostatic deflectors.

A hexapole electrostatic deflector is disclosed, in accordance with one or more embodiments of the present disclosure. In one embodiment, the hexapole electrostatic deflector includes six deflection plates arranged about a radius R, the six deflection plates comprising a first deflection plate, a second deflection plate, a third deflection plate, a fourth deflection plate, a fifth deflection plate, and a sixth deflection plate. In another embodiment, the first deflection plate, the third deflection plate, and the fifth deflection plate are applied with a first focusing voltage, and wherein the second deflection plate, the fourth deflection plate, and the sixth deflection plate are applied with a second focusing voltage.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1:
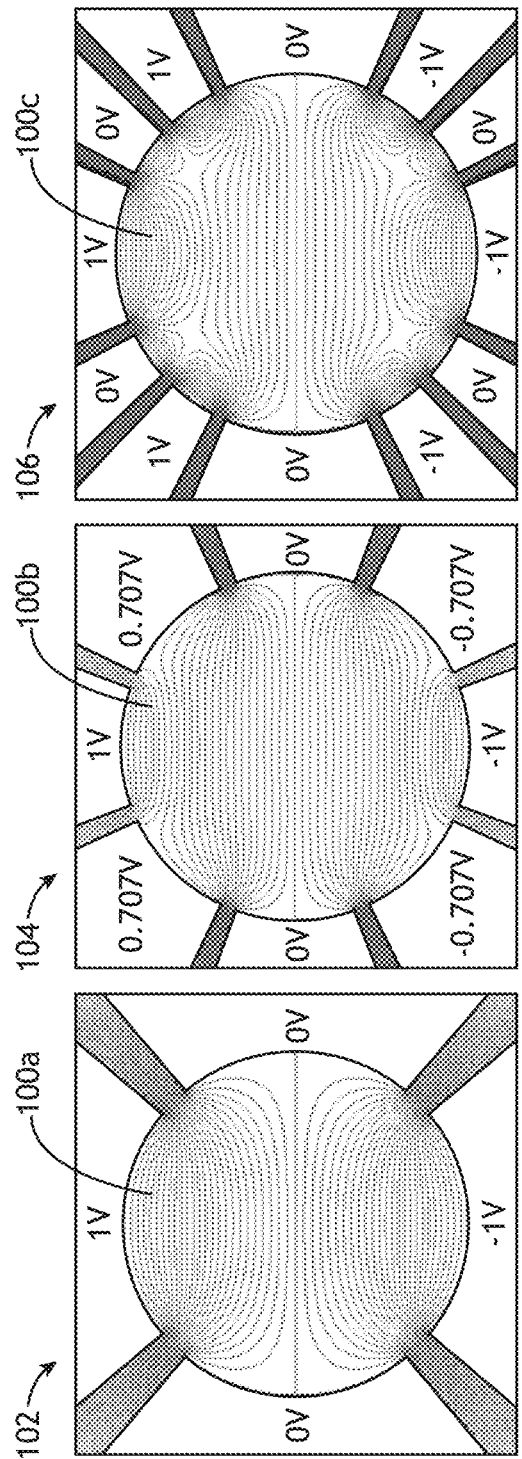
FIG. 1A illustrates a deflection distribution field of a quadrupole electrostatic deflector.
FIG. 1B illustrates a deflection distribution field of an octupole electrostatic deflector.
FIG. 1C illustrates a deflection distribution field of a dodecapole electrostatic deflector.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Referring generally to FIGS. 1-15, a multi-electron beam system is disclosed, in accordance with one or more embodiments of the present disclosure.

Embodiments of the present disclosure are directed to a dual-polarity hexapole electrostatic deflector to be used in a multi-electron beam apparatus. Additional embodiments of the present disclosure are directed to a single-polarity hexapole electrostatic deflector to be used in a multi-electron beam apparatus. Further embodiments of the present disclosure are directed to a micro-deflection array (MDA) consisting of single-polarity hexapole electrostatic deflectors.

As noted previously herein, electron beam inspection systems often utilize a micro-lens array (MLA) comprising hundreds of micro-lenses in order to split primary electron beams into multi-primary electron beamlets. The size of each electron beamlet is in the order of tens of microns, and the beamlets are typically separated by a spacing distance in the order of tens of microns. In order to build a micro scanning system which uses independent primary electron beamlets, a micro-deflection array (MDA) must be integrated into the MLA. Integrating a micro-fabricated MDA often requires the use of electrostatic deflection. In order to achieve sufficient electrostatic deflection performance, third order deflection aberrations must be eliminated.

Current micro-deflection array (MDA) systems utilizing electrostatic deflection have taken various forms, including quadrupole electrostatic deflectors, octupole electrostatic deflectors, and dodecapole electrostatic deflectors. These may be further understood with reference to FIGS. 1A-1C.

FIG. 1A illustrates a deflection distribution field 100a of a quadrupole electrostatic deflector 102. FIG. 1B illustrates a deflection distribution field 100b of an octupole electrostatic deflector 104. FIG. 1C illustrates a deflection distribution field 100c of a dodecapole electrostatic deflector 106.

The quadrupole electrostatic deflector 102, octupole electrostatic deflector 104, and dodecapole electrostatic deflector 106, as illustrated in FIGS. 1A-1C, have been used in existing single electron beam optics systems. The electrostatic deflectors deflect electron beams in the y-direction by dual-polarity scanning signals (e.g., ±1V for the quadrupole electrostatic deflector 102 and the dodecapole electrostatic deflector 106, and ±1V/±0.707V for the octupole electrostatic deflector 104).

Comparing the deflection distribution fields 100a, 100b, 100c, it may be seen that the deflection distribution field 100a generated by the quadrupole electrostatic deflector 102 is less homogenous than the deflection distribution fields 100b, 100c generated by the octupole electrostatic deflector 104 and the dodecapole electrostatic deflector 106, respectively. Additionally, it has been found that quadrupole electrostatic deflector 102 does not sufficiently eliminate third order deflection aberrations. This poor deflection performance renders the quadrupole electrostatic deflector 102 unsuitable for many multi-electron beam inspection systems.

Comparatively, the octupole electrostatic deflector 104 and the dodecapole electrostatic deflector 106 may exhibit better deflection performance in that they may eliminate third order deflection aberrations. However, the utility of the octupole electrostatic deflector 104 and the dodecapole electrostatic deflector 106 may be limited in that they each require multiple voltage sources (e.g., multiple voltage connecting lines) and high numbers of deflection plates. For a single electron beamlet, the octupole electrostatic deflector 104 requires four separate voltage sources (e.g., multiple voltage connecting lines), and eight deflection plates, whereas the dodecapole electrostatic deflector 106 requires two separate voltage sources and twelve deflection plates.

As a result of the octupole electrostatic deflector 104 requiring separate voltage connecting lines for a single electron beamlet, the octupole electrostatic deflector 104 may be ill-suited for multi-electron beam inspection systems which use hundreds to thousands of primary electron beamlets. In these systems the cost associated with the power sources and voltage connecting lines of an octupole electrostatic deflector 104 is prohibitively high. Furthermore, the physical occupation area for each of the four voltage connecting lines is often too large to develop additional primary electron beamlets required for increased throughputs. Conversely, the utility of the dodecapole electrostatic deflector 106 may be limited by spatial restraints. Fabricating the twelve deflection plates of the dodecapole electrostatic deflector 106 into a deflector sized in the order of tens of microns is a difficult and complex process in and of itself. Furthermore, efficiently integrating the twelve deflection plates into a multi-electron beam system with hundreds to thousands of beamlets may be geometrically and spatially prohibitive.

As such, it may be found that each of the quadrupole electrostatic deflector 102, the octupole electrostatic deflector 104, and the dodecapole electrostatic deflector 106 exhibit respective shortfalls which may render each ill-suited for particular multi-electron beam inspection systems. Accordingly, embodiments of the present disclosure are directed to electrostatic deflectors which may cure one or more of the shortfalls of these previous approaches. More particularly, some embodiments of the present disclosure are directed to the use of a hexapole electrostatic deflector.

In order to compare the attendant advantages of embodiments of the present disclosure, a mathematical analysis of an octupole electrostatic deflector 104 may prove to be illustrative.

Figure 2:
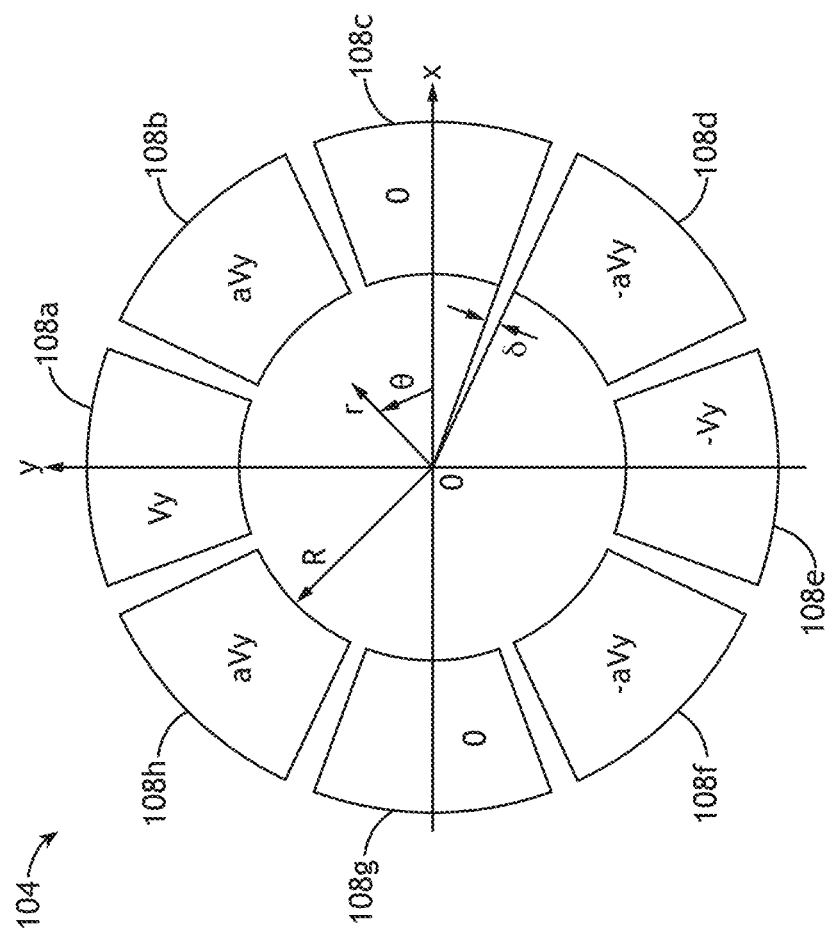
FIG. 2 illustrates an octupole electrostatic deflector.

FIG. 2 illustrates an octupole electrostatic deflector 104. It is noted herein that the octupole electrostatic deflector 104 may correspond to the octupole electrostatic deflector 104 illustrated in FIG. 1B. As noted previously, octupole electrostatic deflector 104 requires four separate voltage sources (e.g., ±1V and ±0.707V), and eight deflection plates (e.g., first deflection plate 108a, second deflection plate 108b, third deflection plate 108c, fourth deflection plate 108d, fifth deflection plate 108e, sixth deflection plate 108f, seventh deflection plate 108g, and eighth deflection plate 108h).

As can be seen in FIG. 2, dual-polarity deflection signals ±$V_y$ and ±a$V_y$ may be used for y-direction scanning. The parameter "a" is used to control deflection potential distributions in order to eliminate the third order deflection field and/or to eliminate third order deflection aberrations. The value "R" defines the inner radius for the octupole electrostatic deflector 104, and "δ" is the angle of the gap between the deflection plates 108a-108h. Continuing with reference to FIG. 2, let $\phi(r,\theta)$ be the electrostatic potential distributions in r≤R and −π≤θ≤π. Expanding $\phi(r,\theta)$ into a Fourier series results in Equation 1:

$$\phi(r,\theta)=A_0+\Sigma_{k=1}^{\infty}r^k(A_k \cos k\theta+B_k \sin k\theta)(1) \qquad (1)$$

It is noted herein that Equation 1 is a solution of the Laplace equation that defines the electrostatic potential distributions within the deflection region of the octupole electrostatic deflector 104. It is further noted herein that $A_0$, $A_k$, and $B_k$ in Equation 1 are the Fourier coefficients, defined by the boundary condition $\phi(R,\theta)$ and described by Equation 2, Equation 3, and Equation 4:

$$A_0 = \frac{1}{2\pi}\int_{-\pi}^{\pi}\phi(R,\theta)d\theta (2) \qquad (2)$$

$$A_k = \frac{1}{\pi R^k}\int_{-\pi}^{\pi}\phi(R,\theta)\cos k\theta d\theta (3) \qquad (3)$$

$$B_k = \frac{1}{\pi R^k}\int_{-\pi}^{\pi}\phi(R,\theta)\sin k\theta d\theta (4) \qquad (4)$$

The anti-symmetrical potential distribution over (r,θ) generated by the applied deflection signals ±$V_y$ and ±a$V_y$ may be described by Equation 5 and Equation 6:

$$\phi(r,\theta)=-\phi(r,-\theta) \qquad (5)$$

$$\phi(r,\theta)=-\phi(-r,\theta) \qquad (6)$$

The odd function over θ in Equation 5 causes $A_k$ (k=0, 1, 2, 3, . . . ) all to be equal to zero. Conversely, the odd function over r (r<R) in Equation 6 allows the polar coordinate r in Equation 1 to appear only in odd-order powers. Accordingly, Equation 1 may be simplified to produce Equation 7:

$$\phi(r,\theta)=\Sigma_{k=1}^{\infty}r^k B_k \sin k\theta (k=1,3,5 \ldots ) \qquad (7)$$

For a single electron beam deflection, the beam size and deflection field of view may be much smaller than the deflector size (e.g., r<<R) such that Equation 7, taken up to the third order term, is sufficiently accurate in describing the deflection potential distributions. Truncating Equation 7 up to the third order term may be illustrated by Equation 8:

$$\phi(r,\theta)=\Sigma_{k=1}^{\infty}r^k B_k \sin k\theta \approx B_1 r \sin \theta+B_3 r^3 \sin 3\theta \qquad (8)$$

Converting Equation 8 into a Cartesian coordinate system generates Equation 9:

$$\phi(x,y)=B_1 y+B_3(3yx^2-y^3) \qquad (9)$$

For the octupole electrostatic deflector 104, it may be proved that the third order Fourier coefficient $B_3$ in Equation 9 is zero if the parameter "a" depicted in FIG. 2 (e.g., ±a$V_y$) is set equal to 1/√2=0.707, as depicted in FIG. 1B. In this regard, setting the parameter "a" equal to 0.707, as depicted in FIG. 1B, allows the octupole electrostatic deflector 104 to eliminate third order deflection aberrations. As such, the central area of the deflection distribution field 100b in FIG. 1B appears fairly uniform. This relationship is described in further detail by Xinrong Jiang and Zhao-feng Na in "The Field Solutions for Multipole Electrostatic Deflectors," published on Oct. 13, 1986, which is incorporated by reference in the entirety.

Similarly, with regards to the dodecapole electrostatic deflector 106 (e.g., FIG. 1C), it may be proved that the third order Fourier coefficient $B_3$ in Equation 9 is zero if the narrow plate angle is 16 degrees, the wide plate angle equal 46 degrees, and the gap angle δ between plates is 4 degrees (e.g., δ=4°). Accordingly, the dodecapole electrostatic deflector 106 is also able to eliminate third order deflection aberrations. This relationship is described in further detail in U.S. Pat. No. 8,536,538 B2, filed Feb. 16, 2011, entitled "MULTIPOLE-POLE ELECTROSTATIC DEFLECTOR FOR IMPROVING THROUGHPUT OF FOCUSED ELECTRON BEAM INSTRUMENTS," naming Xinrong Jiang as inventor. This reference is herein incorporated by reference in the entirety.

Conversely, it may be found that the third order Fourier coefficient $B_3$ in Equation 9 is not zero for the quadrupole electrostatic deflector 102 illustrated in FIG. 1A. This is due to the fact that there are no parameters (e.g., applied voltage, plate angle, or the like) which may be used to control the boundary conditions. Therefore, as described previously herein, the quadrupole electrostatic deflector 102 generates a non-zero third order deflection field, and is unable to eliminate third order deflection aberrations. As such, quadrupole electrostatic deflector 102 is ill-suited for many multi-electron beam inspection systems.

Figure 3:
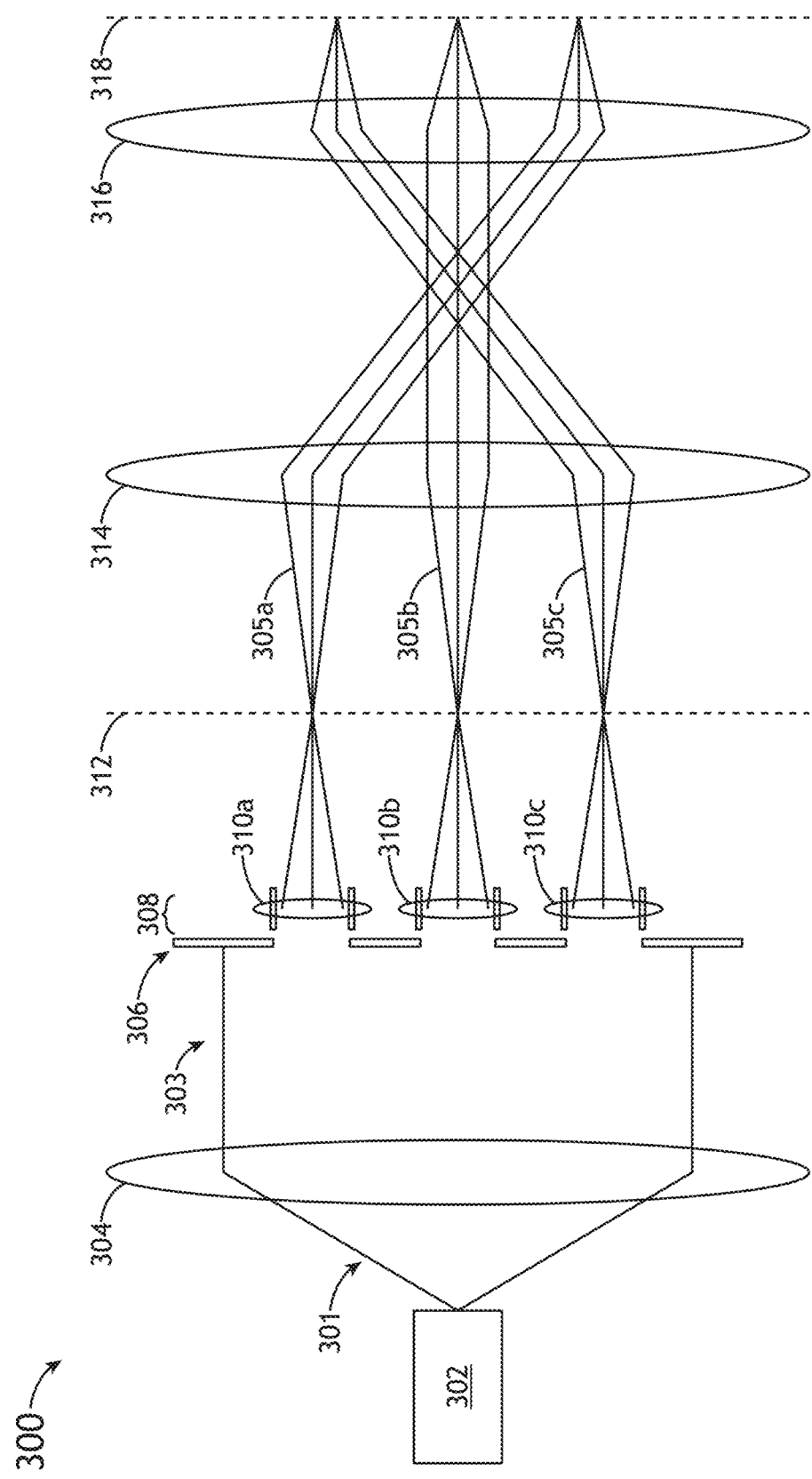
FIG. 3 illustrates a multi-electron beam apparatus, in accordance with one or more embodiments of the present disclosure.

FIG. 3 illustrates a multi-electron beam apparatus 300, in accordance with one or more embodiments of the present disclosure. Multi-electron beam apparatus 300 may include, but is not limited to, an electron source 302, an electron gun lens 304, an aperture 306, a micro-lens array 308 (e.g., MLA 308), a micro-deflection array 310 (e.g., MDA 310), a transfer lens 314, and an objective lens 316.

In one embodiment, the electron source 302 is configured to emit a primary electron beam 301. The electron source 302 may include any type of electron gun or electron emitter known in the art including, but not limited to, thermal field emission (TFE) sources. In another embodiment, the gun lens 304 may be configured to accelerate and/or focus the primary electron beam 301 in order to form a primary electron beam 303. The gun lens 304 may be further configured to direct the primary electron beam 303 to the aperture 306.

In another embodiment, the primary electron beam 303 is directed through the aperture 306 to a micro-lens array 308 (e.g., MLA 308). As noted previously herein, the MLA 308 may include an integrated micro-deflection array 310 (e.g., MDA 310). In one embodiment, the MDA 310 may include hundreds of micro electrostatic deflectors. The MLA 308 and MDA 310 may be configured to receive the primary electron beam 303 intro multiple primary electron beamlets 305. For example, the MLA 308 and/or MDA 310 may be configured to receive a primary electron beam 303 and split the primary electron beam 303 into hundreds of primary electron beamlets 305. In another embodiment, the MLA 308/MDA 310 is configured to focus the primary electron beamlets 305 at a crossover plane 312. In this regard, the crossover plane 312 may be regarded as the image plane of the MLA 308/MDA 310. Furthermore, optical components from the electron source 302 to the crossover plane (e.g., electron source 302, electron gun lens 304, aperture 306, MLA 308, MDA 310, and the like) may be regarded as "illumination optics."

In another embodiment, primary electron beamlets 305 are directed to "projection optics." Projection optics of multi-electron beam apparatus 300 may include, but are not limited to, the transfer lens 314 and the objective lens 316. In addition to serving as the image plane of the MLA 308/MDA 310, it is noted herein that the crossover plane 312 may be regarded as the object plane of the projection optics (e.g., transfer lens 314 and the objective lens 316). Accordingly, primary electron beamlets 305 are directed by the transfer lens 314 to the objective lens 316. In another embodiment, the objective lens 316 is configured to focus and direct the primary electron beamlets 305 to a wafer plane 318. In this regard, the wafer plane 318 may be regarded as the image plane of the projection optics (e.g., transfer lens 314, objective lens 316, and the like). The projection optics may be configured to project the primary electron beamlets 305 to the wafer plane 318 with a defined optical demagnification. In one embodiment, the wafer plane 318 may correspond to the surface of a sample, such that the projection optics are configured to direct and focus the primary electron beamlets 305 to the surface of a sample.

In another embodiment, the MLA 308/MDA 310 may be configured to simultaneously and independently scan each of the primary electron beamlets 305 at the wafer plane 318. Primary electron beamlets 305 at the wafer plane 318 may be used for any characterization processes known in the art including, but not limited to, inspection, review, image-based metrology, and the like.

Figure 4:
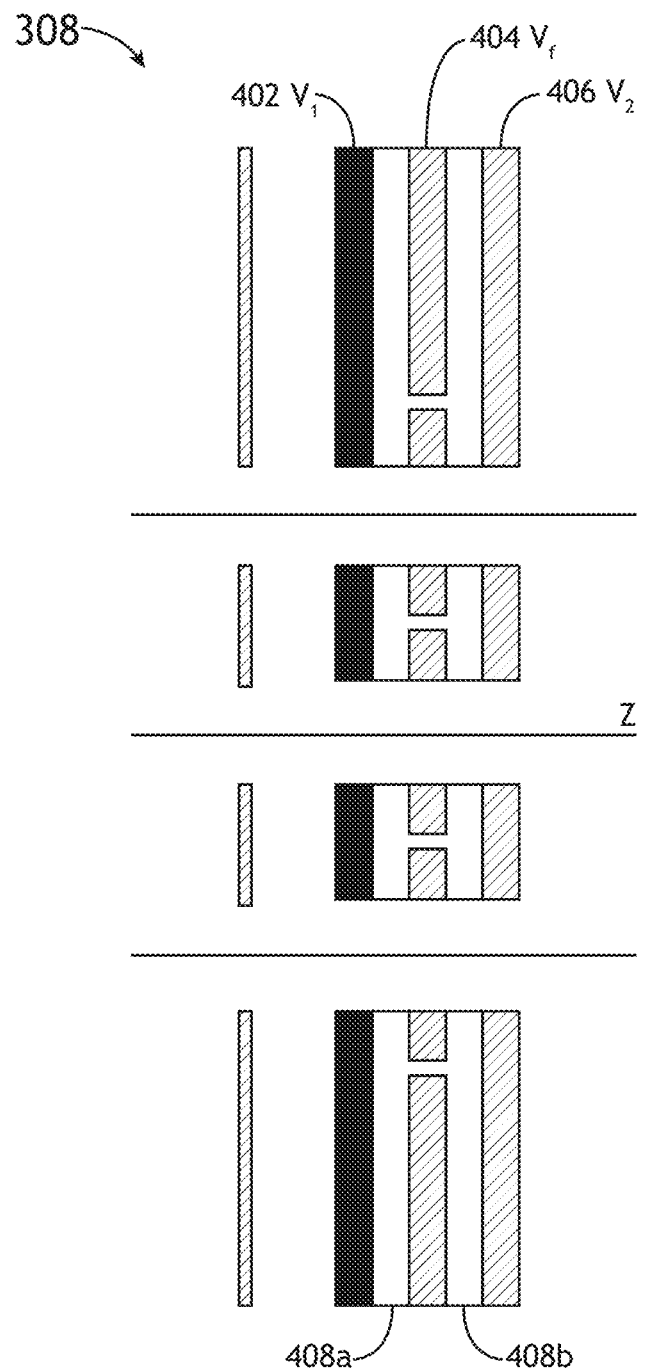
FIG. 4 illustrates a cross-sectional view of a micro-lens array (MLA), in accordance with one or more embodiments of the present disclosure.

FIG. 4 illustrates a cross-sectional view of a micro-lens array 308 (e.g., MLA 308), in accordance with one or more embodiments of the present disclosure. The MLA 308 may include several layers including, but not limited to, a first electrode 402 applied with a focusing voltage of $V_1$, a focusing electrode 404 applied with a focusing voltage of $V_f$, a second electrode 406 applied with a focusing voltage of $V_2$, a first insulating layer 408a, and a second insulating layer 408b.

In one embodiment, the MLA 308 may include an electrostatic Einzel-lens based MLA. For example, the focusing electrode 404 of MLA 308 may include hundreds of electrostatic Einzel lenses. The thicknesses of the various layers of MLA 308 may be varied. For example, the thickness of the layers of the MLA 308 (e.g., first electrode 402, focusing electrode 404, second electrode 406, and insulating layers 408a, 408b) may be in the order of tens of microns.

Figure 5:
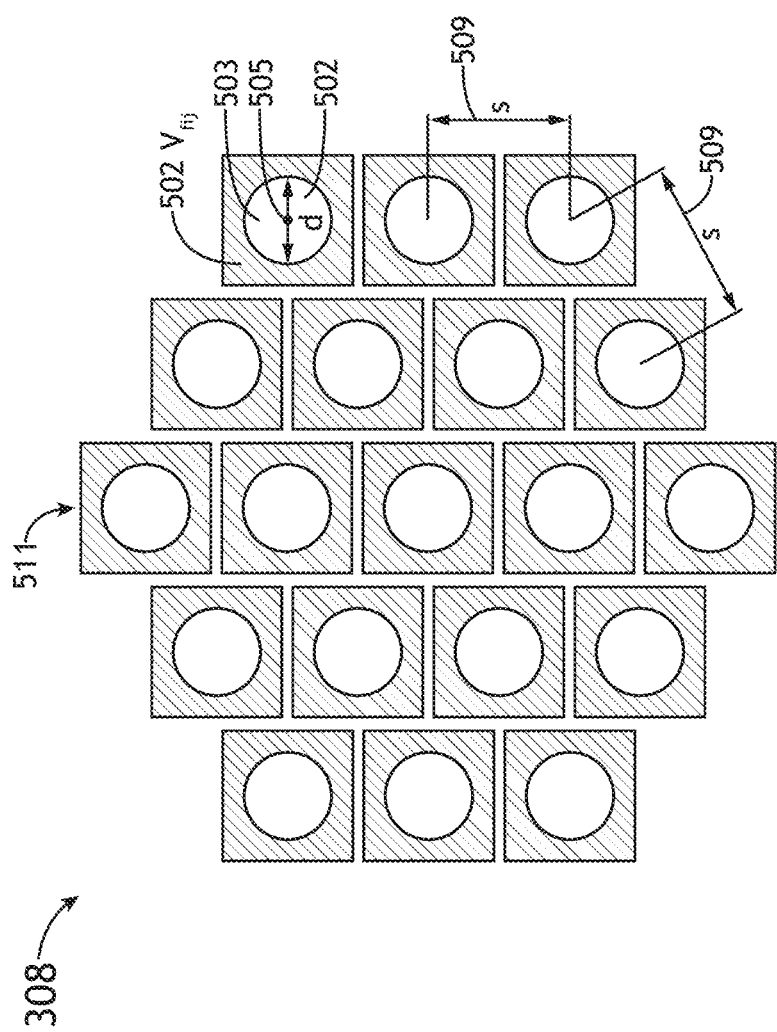
FIG. 5 illustrates a simplified view of a micro-lens array (MLA) including micro-lenses, in accordance with one or more embodiments of the present disclosure.

FIG. 5 illustrates a simplified view of the micro-lens array 308 (e.g., MLA 308) including micro-lenses 502, in accordance with one or more embodiments of the present disclosure.

In one embodiment, the MLA 308 may comprise a number of focusing micro-lenses 502 (e.g., micro electrostatic deflectors 502). The micro electrostatic deflectors 502 may include any micro-lenses known in the art including, but not limited to, micro Einzel lenses. In another embodiment, each of the micro electrostatic deflectors 502 may be applied with focusing voltages $V_{fij}$. In another embodiment, each micro electrostatic deflector 502 includes a bore 503 with a center 505 and a diameter (d) 507. In this regard, each bore 503 may be substantially circular in shape. However, this is not to be regarded as a limitation on the scope of the present disclosure, unless noted otherwise herein. In another embodiment, the micro electrostatic deflectors 502 are spaced with a spacing distance (s) 509, wherein the spacing distance (s) 509 is measured between the centers 505 of the bores 503 of each micro electrostatic deflector 502.

In another embodiment, the bore diameter (d) 507 and the spacing distance (s) 509 between each of the micro electrostatic deflectors 502 may be in the order of tens of microns. In one embodiment, the bore diameter 507 and the spacing distance (s) 509 of the micro electrostatic deflectors 502 is uniform throughout the MLA 308. However, this is not to be regarded as a limitation of the present disclosure, unless noted otherwise herein. Similarly, referring to FIG. 4, it is noted herein that the bore diameters 507 of the first electrode 402, the focusing electrode 404, and the second electrode 406 may be uniform or different. In one embodiment, the bore diameters 507 of the aperture 306 is less than the smallest bore diameter 507 of the first electrode 402, focusing electrode 404, and second electrode 406.

In one embodiment, the voltages applied to each of the micro electrostatic deflectors 502 (e.g., applied voltages $V_{fij}$) may be controlled independently of one another. In one embodiment, the applied voltages $V_{fij}$ may be configured to be equal for each micro electrostatic deflectors 502. In an additional and/or alternative embodiment, one or more applied voltages $V_{fij}$ may be different among the micro electrostatic deflectors 502. For instance, one or more applied voltages $V_{fij}$ may be different from one another, such that $V_{fij} \neq V_{fi+1j}$, $V_{fij} \neq V_{fi+1j+1}$, and the like.

The micro electrostatic deflectors 502 may be arranged in any manner known in the art in order to make up the MLA 308. For example, as shown in FIG. 5, the micro electrostatic deflectors 502 may be arranged in a hexagonal configuration. It is noted herein that a hexagonal configuration may comprise the closest configuration to achieving rotational symmetry, and may provide a number of optical advantages. In embodiments with a hexagonal configuration, the MLA 308 may include a central column 511 of micro electrostatic deflectors 502. It is noted herein that the central column 511 of a hex-configuration MLA 308 may be used to define the number of micro electrostatic deflectors 502 in the MLA 308. This relationship may be further understood with reference to FIG. 6.

Figure 6:
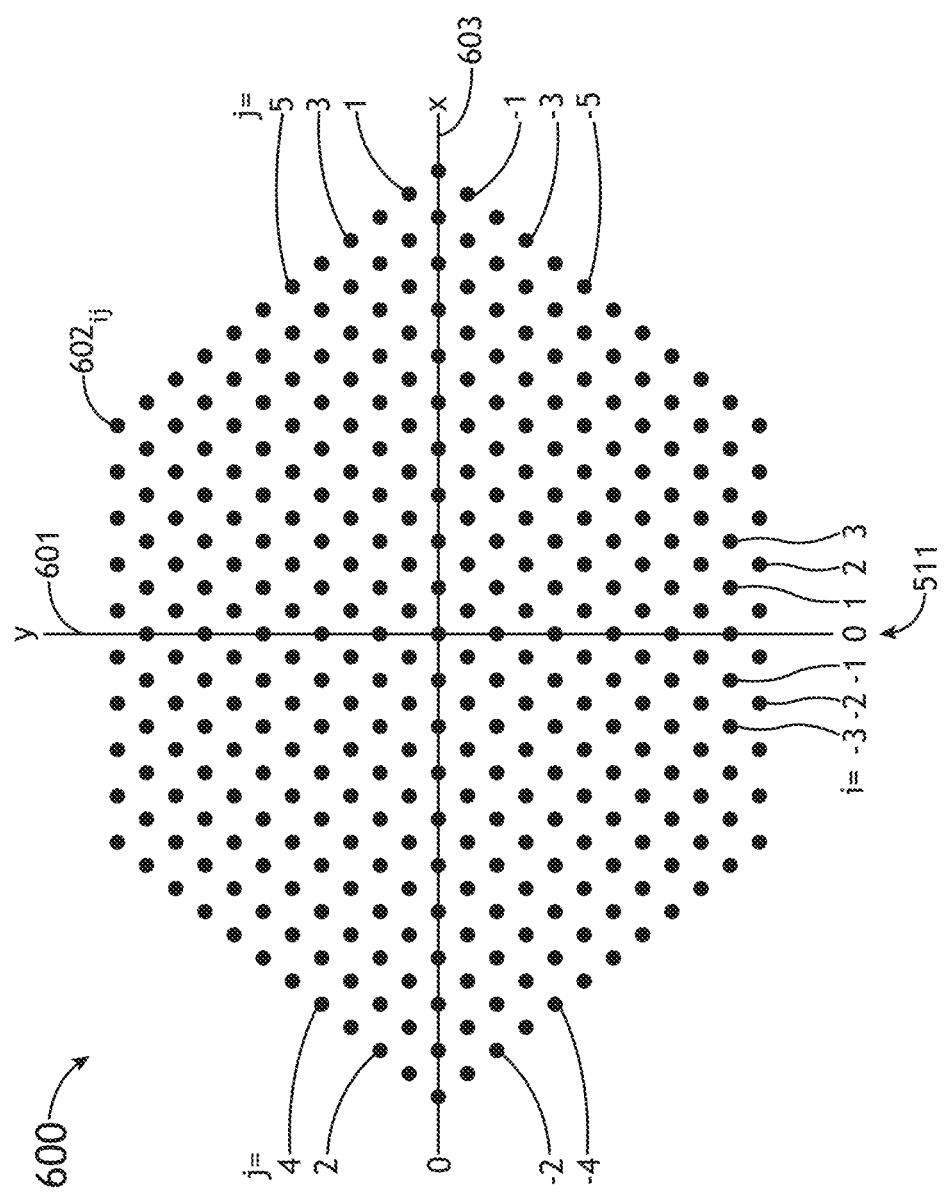
FIG. 6 illustrates a diagram depicting electron spots of primary electron beamlets, in accordance with one or more embodiments of the present disclosure.

FIG. 6 illustrates a diagram 600 depicting electron spots 602ij of primary electron beamlets, in accordance with one or more embodiments of the present disclosure. It is noted herein that an MLA 308 with a hexagonal configuration may generate the hexagonal-configuration of electron spots 602ij in the crossover plane 312 (e.g., image plane of the MLA 308).

In one embodiment, each of the primary electron beamlets 305 may be simultaneously and independently controlled by the MLA 308. Accordingly, each of the electron spots 602ij indicating an electron beamlet 305 may be labeled for the purpose of identification. As shown in FIG. 6, electron spots 602ij may be identified using ordered pairs (i, j), where i denotes the number of columns away from the y-axis 601, and j denotes the number of rows away from the x-axis 603. Thus, i and j may be defined by Equation 10, Equation 11, and Equation 12:

$$i = -\frac{M_C-1}{2}, -\frac{M_C-3}{2}, \ldots, -2, \quad (10)$$
$$-1, 0, 1, 2, \ldots, \frac{M_C-3}{2}, \frac{M_C-1}{2}$$

$$j = -\frac{M_C-1}{2}, -\frac{M_C-3}{2}, \ldots, -2, -1, 1, 2, \ldots, \frac{M_C-3}{2}, \frac{M_C-1}{2} \quad (11)$$

$$j = -\frac{M_C-3}{2}, -\frac{M_C-5}{2}, \ldots, -2, \quad (12)$$
$$-1, 0, 1, 2, \ldots, \frac{M_C-5}{2}, \frac{M_C-3}{2}$$

wherein Equation 11 defines j when i is odd, Equation 12 defines j when i is even, and $M_c$ denotes the number of electron spots 602$ij$ along the y-axis 601 (e.g., along the central column 511).

In another embodiment, the total number of primary electron beamlets 305 (or electron spots 602$_{ij}$), indicated by $MB_{tot}$, may be calculated by Equation 13:

$$MB_{tot} = \frac{1}{4}(1 + 3M_C^2) \quad (13)$$

For example, referring to FIG. 6, there are 21 primary electron beamlets 305 along the central column 511 (e.g., j=0 along the x-axis 603) of diagram 600. This may be denoted as $M_c$=21. By substituting $M_c$=21 in Equation 13, it may be determined that there are a total of 331 electron spots 602$_{ij}$ (e.g., primary electron beamlets 305) in the hexagonal-arranged diagram 600. Accordingly, $MB_{tot}$=331 for diagram 600.

Equations 10-13 may also be applied to the MLA 308 illustrated in FIG. 5. For example, as shown in FIG. 5, there are 5 micro-lenses 502 in the central column 511 of the MLA 308 (e.g., $M_c$=5). By substituting $M_c$=5 in Equation 13, it may be determined that there are a total of 19 micro-lenses 502 in MLA 308 (e.g., $MB_{tot}$=19).

As noted previously herein, in order to scan hundreds of primary electron beamlets 305 separately and/or independently, a micro-deflection array (e.g., MDA 310) must be integrated into the MLA 308, as depicted in FIG. 3. In one embodiment, MDA 310 comprises hundreds of micro scanning deflectors. In a preferred embodiment, micro scanning deflectors of MDA 310 are as simple as possible and require the fewest number of voltage sources/voltage connecting lines, and the fewest number of deflection plates. Low numbers of required voltage connecting lines and/or deflection plates simplifies the integration of the MDA 310 into the MLA 308, alleviates spatial constraints, and lowers the operating cost of the MDA 310. However, it is desirable that the micro scanning deflectors of MDA 310 exhibit sufficient electrostatic deflection performance in that they sufficiently eliminate the third order deflection field in order to eliminate third order deflection aberrations.

Figure 7:
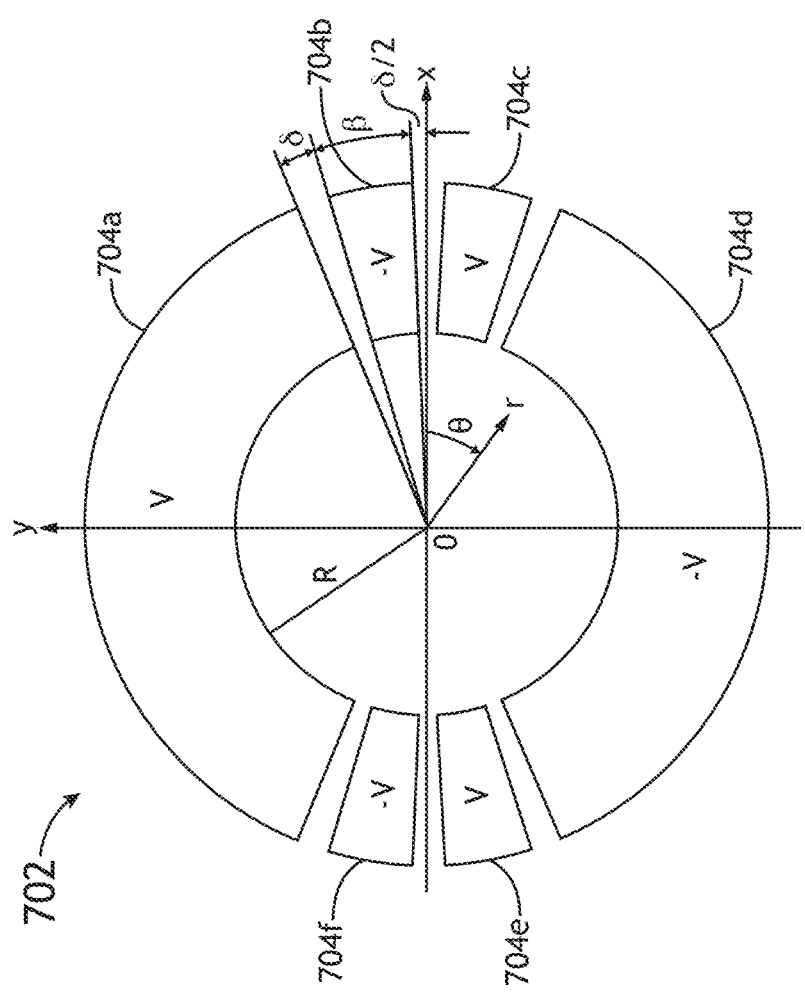
FIG. 7 illustrates a dual-polarity hexapole electrostatic deflector, in accordance with one or more embodiments of the present disclosure.

FIG. 7 illustrates a dual-polarity hexapole electrostatic deflector 702, in accordance with one or more embodiments of the present disclosure. The hexapole electrostatic deflector 702 may include a first deflection plate 704a, a second deflection plate 704b, a third deflection plate 704c, a fourth deflection plate 704d, a fifth deflection plate 704e, and a sixth deflection plate 704f. It is contemplated herein that the dual-polarity hexapole electrostatic deflector 702 may be implemented within the MLA 308 of the multi-electron beam apparatus 300. It is further recognized, however, that the hexapole electrostatic deflector 702 is not limited to the multi-electron beam apparatus 300.

In one embodiment, dual-polarity hexapole electrostatic deflector 702 includes dual-polarity scanning signals with magnitudes of ±1V. With the dual-polarity scanning signals, the dual-polarity hexapole electrostatic deflector 702 requires only two voltage sources and two voltage connecting lines (e.g., one voltage connecting line for +1V, and one voltage connecting line for −1V). As compared to the octupole electrostatic deflector 104 illustrated in FIG. 1B, which requires four voltage connecting lines, the dual-polarity hexapole electrostatic deflector 702 requires half the amount of voltage sources and voltage connecting lines. The fewer number of voltage sources and voltage connecting lines allows the dual-polarity hexapole electrostatic deflector 702 to provide numerous spatial and cost advantages over the octupole electrostatic deflector 104. Furthermore, the dual-polarity hexapole electrostatic deflector 702 has half the deflection plates of the dodecapole electrostatic deflector 106 illustrated in FIG. 1C (6 deflection plates as compared to 12 deflection plates), significantly alleviating spatial constraints and integration concerns.

It has been found that proper selection of the plate angle β and gap angle δ of the dual-polarity hexapole electrostatic deflector 702 may eliminate the third order deflection field, and therefore third order deflection aberrations. A mathematical analysis of the dual-polarity hexapole electrostatic deflector 702 may prove to be illustrative.

With the dual-polarity voltage configuration of the dual-polarity hexapole electrostatic deflector 702, the anti-symmetric relationships illustrated in Equation 5 and Equation 6 hold. Accordingly, the electrostatic potential distributions ø(r,θ) for the hexapole electrostatic deflector 702 is given by Equation 7, in which the Fourier coefficients $B_k$ (k=1, 3, 5, . . . ) are defined by Equation 4. With the electrostatic potential distribution φ(r,θ) the Fourier coefficient $B_k$ can be calculated, and may be defined by Equation 14:

$$B_k = \frac{1}{\pi R^k} \int_{-\pi}^{\pi} \phi(R, \theta) \sin k\theta \, d\theta \quad (14)$$

Equation 14 may then be expanded to generate Equation 15:

$$B_K = \frac{4V}{\pi k R^k} \cos\left(\frac{k\delta}{2}\right)\{2 \cos[k(\beta + \delta)] - 1\} \quad (15)$$

wherein k=1, 3, 5, . . . , and the like.

It is noted herein that the third order Fourier coefficient $B_3$ is equal to zero if the plate angle β and gap angle δ are selected such that Equation 16 is satisfied:

$$\beta + \delta = 20° \quad (16)$$

Equation 16 may be referred to as the Uniform Field Condition (UFC) for the dual-polarity hexapole electrostatic deflector 702. Similar to before, it is noted herein that the dual-polarity hexapole electrostatic deflector 702 does not exhibit Fourier coefficients $B_2$ and $B_4$. Furthermore, the Fourier coefficient $B_3$ is zero for the dual-polarity hexapole electrostatic deflector 702. Accordingly, the deflection potential distribution over (r,θ) for r<R for the dual-polarity hexapole electrostatic deflector 702 may be simplified and defined by Equation 17 and Equation 18:

$$\phi(r,\theta) = B_1 r \sin\theta \quad (17)$$

$$\phi(x,y) = B_1 y \quad (18)$$

wherein Equation 17 defines the deflection potential distribution for the dual-polarity hexapole electrostatic deflector 702 in polar coordinates, and Equation 18 defines the deflection potential distribution for the dual-polarity hexapole electrostatic deflector 702 in Cartesian coordinates.

The deflection electrical strength in the y-direction $E_y$ for the dual-polarity hexapole electrostatic deflector 702 is therefore defined by Equation 19:

$$E_y = E_y(z) = -\frac{\partial \phi(x,y)}{\partial y} = -B_1 = -1.12 \frac{V}{R}\cos\left(\frac{\delta}{2}\right) \quad (19)$$

A more detailed mathematical analysis of the dual-polarity hexapole electrostatic deflector 702 is described by Xinrong Jiang in "Evaluations of MSA, MFA and MDA built-in T1 Micro Einzel Lenses," published on May 11, 2018, which is incorporated herein by reference in the entirety.

Figure 8:
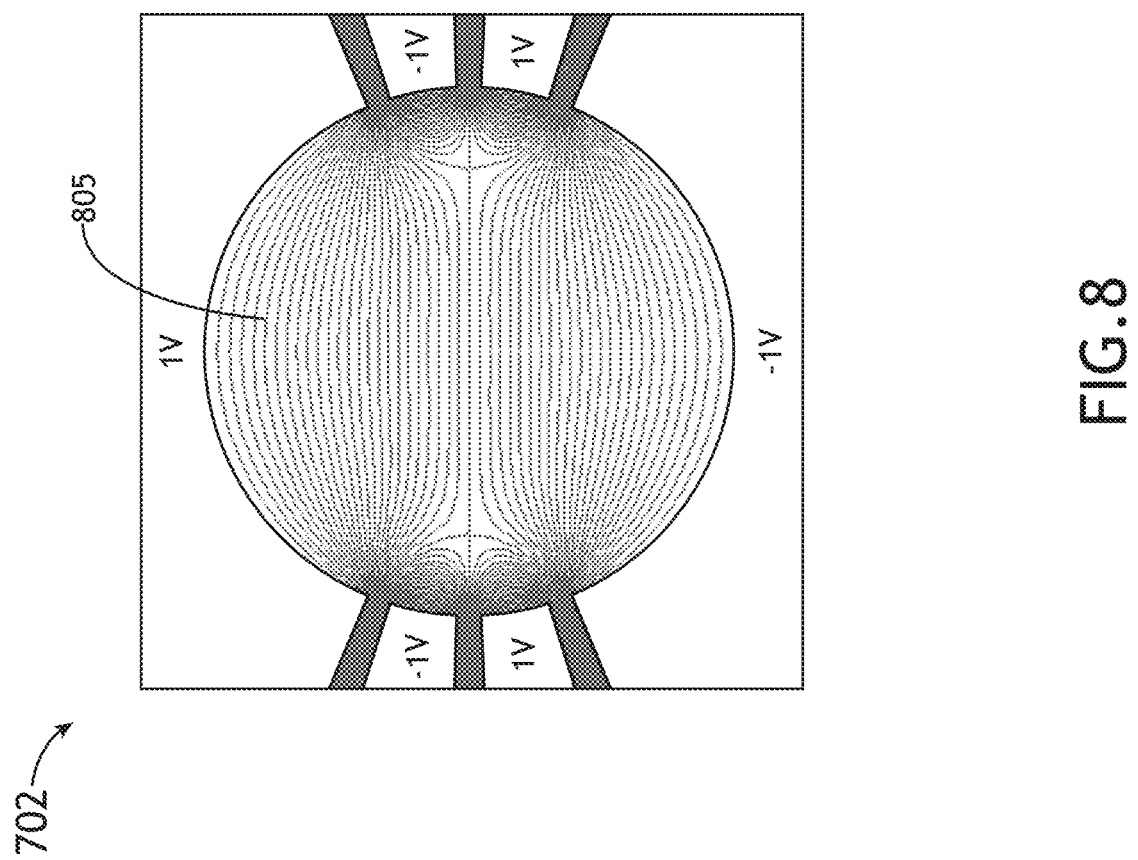
FIG. 8 illustrates a deflection distribution field of a hexapole electrostatic deflector, in accordance with one or more embodiments of the present disclosure.

FIG. 8 illustrates a deflection distribution field 800 of a dual-polarity hexapole electrostatic deflector 702, in accordance with one or more embodiments of the present disclosure.

As may be seen in FIG. 8, in meeting the Uniform Field Condition (UFC) defined in Equation 16 for the plate angle β and gap angle δ, the dual-polarity hexapole electrostatic deflector 702 presents a fairly wide uniform deflection distribution field 800. By applying a dual-polarity voltage ±1V to deflection plates 704a-704f, the dual-polarity hexapole electrostatic deflector 702 generates a substantially homogenous deflection distribution field 800. Comparing deflection distribution field 800 to deflection distribution fields 100a, 100b, 100c, it may be appreciated that the dual-polarity hexapole electrostatic deflector 702 exhibits an electrostatic deflection performance which is as good as, if not better than, the electrostatic deflection performance of the quadrupole electrostatic deflector 102, the octupole electrostatic deflector 104, and the dodecapole electrostatic deflector 106.

Furthermore, the dual-polarity hexapole electrostatic deflector 702 may provide advantages over the various other deflectors in that the dual-polarity hexapole electrostatic deflector 702 requires only two voltage sources and two voltage connecting lines (as compared to four voltage connecting lines required by the octupole electrostatic deflector 104), and requires only six deflection plates (as compared to the eight and twelve deflection plates of the octupole electrostatic deflector 104 and the dodecapole electrostatic deflector 106). It is noted herein that the high electrostatic deflection performance and the simplicity of dual-polarity hexapole electrostatic deflector 702 may allow for high optical performance and easy, efficient integration into a micro scanning system (e.g., multi-electron beam apparatus 300).

Figure 9:
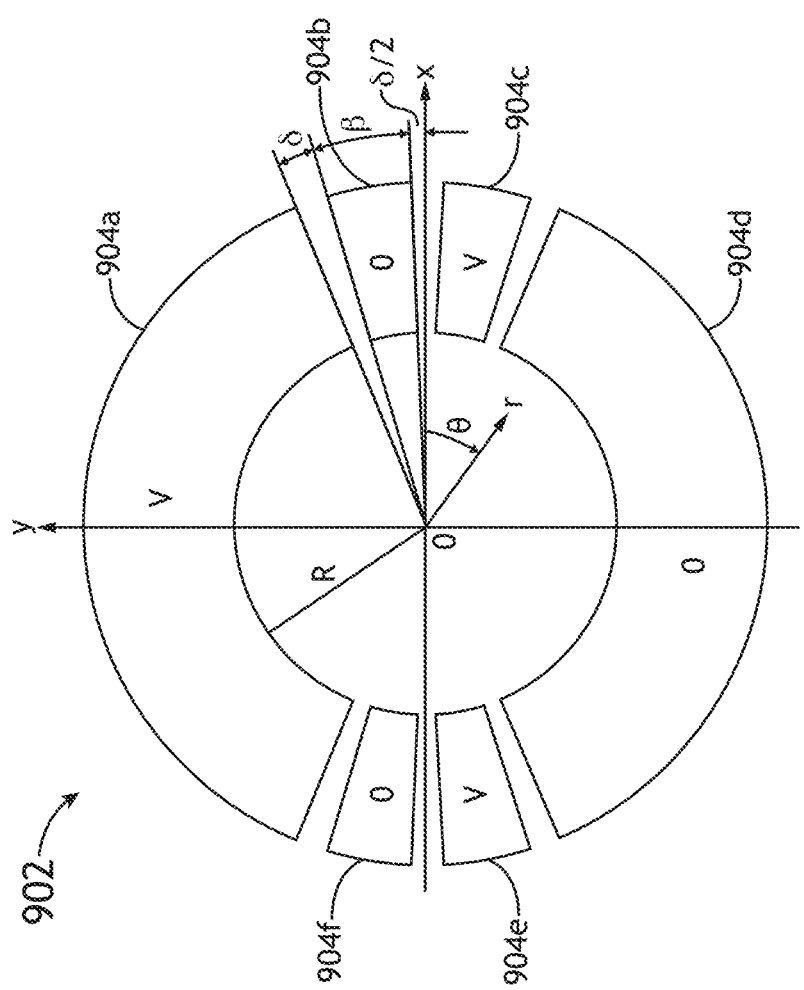
FIG. 9 illustrates a single-polarity hexapole electrostatic deflector, in accordance with one or more embodiments of the present disclosure.

FIG. 9 illustrates a single-polarity hexapole electrostatic deflector 902, in accordance with one or more embodiments of the present disclosure. The hexapole electrostatic deflector 902 may include a first deflection plate 904a, a second deflection plate 904b, a third deflection plate 904c, a fourth deflection plate 904d, a fifth deflection plate 904e, and a sixth deflection plate 904f. It is contemplated herein that the single-polarity hexapole electrostatic deflector 902 may be implemented within the MDA 310 of the multi-electron beam apparatus 300. It is further recognized, however, that the single-polarity hexapole electrostatic deflector 902 is not limited to the multi-electron beam apparatus 300. It is further noted herein that the description associated with dual-polarity hexapole electrostatic deflector 702 may be regarded as applying to the single-polarity hexapole electrostatic deflector 902, unless noted otherwise herein.

In one embodiment, the single-polarity hexapole electrostatic deflector 902 is a single-polarity hexapole electrostatic deflector with a single deflection voltage (V). As compared to the dual-polarity hexapole electrostatic deflector 702 which required two voltage sources/voltage connecting lines (e.g., ±1V), the single-polarity hexapole electrostatic deflector 902 requires only one voltage connecting line. It may be appreciated herein that the fewer voltage connecting lines required by the single-polarity hexapole electrostatic deflector 902 may provide a number of operating cost and spatial advantages. For example, because it only requires one voltage connecting line, it may be possible to integrate a higher density of micro single-polarity hexapole electrostatic deflectors 902 in MDA 310, thereby enabling the multi-electron beam apparatus 300 to scan hundreds up to thousands beamlets independently and simultaneously.

It is noted herein that the anti-symmetric conditions illustrated in Equation 5 and Equation 6 may not completely hold true for the single-polarity hexapole electrostatic deflector 902. As such, the Fourier coefficient $A_k$ may be unequal to zero (e.g., $A_k \neq 0$), and the potential electrostatic distribution for the single-polarity hexapole electrostatic deflector 902 may be completely described by Equation 1, which is repeated below:

$$\phi(r,\theta) = A_0 + \Sigma_{k=1}^{\infty} r^k (A_k \cos k\theta + B_k \sin k\theta) \quad (1)$$

Solving for the Fourier coefficient $A_0$, $A_0$ may be described by Equation 20:

$$A_0 = \frac{1}{2\pi}\int_{-\pi}^{\pi} \varphi(R,\theta)d\theta = \frac{V}{2\pi}(\pi - 3\delta) \quad (20)$$

Similarly, the Fourier coefficient $A_k$ may be described by Equation 21 and Equation 22:

$$A_k = \frac{1}{\pi R^k}\int_{-\pi}^{\pi} \phi(R,\theta)\cos k\theta d\theta = 0 \quad (21)$$

$$A_k = \frac{1}{\pi R^k}\int_{-\pi}^{\pi} \phi(R,\theta)\cos k\theta d\theta = -\frac{2V}{\pi k R^k}\sin k\frac{\delta}{2}\{2\cos[k(\beta+\delta)]+1\} \quad (22)$$

wherein Equation 21 defines $A_k$ when k=1, 3, 5, . . . , and Equation 22 defines $A_k$ when k=2, 4, 6, . . . .

The Fourier coefficient $B_k$ may be found to be described by Equation 23 and Equation 24:

$$B_k = \frac{1}{\pi R^k}\int_{-\pi}^{\pi} \phi(R,\theta)\sin k\theta d\theta = \frac{2V}{\pi k R^k}\cos k\frac{\delta}{2}\{2\cos[k(\beta+\delta)]+1\} \quad (23)$$

$$B_k = \frac{1}{\pi R^k}\int_{-\pi}^{\pi} \phi(R,\theta)\sin k\theta d\theta = 0 \quad (24)$$

wherein Equation 23 defines $B_k$ when k=2, 4, 6, . . . , and Equation 24 defines $B_k$ when k=1, 3, 5, . . . .

Additionally, with single-polarity hexapole electrostatic deflector 902, it may be found that the Fourier constant $B_3=0$ when the Uniform Field Condition (UFC) is satisfied in Equation 16 (e.g., $B_3=0$ when $\beta+\delta=20°$). By selecting $\beta$ and $\delta$ to meet the UFC as defined by Equation 16, and by dropping the fifth-order term and subsequent order terms from Equation 1, the electrostatic potential distributions for the single-polarity hexapole electrostatic deflector 902 may be defined by Equation 25 and Equation 26:

$$\phi(r,\theta)=A_0+B_1 r \sin \theta+r^2 A_2 \cos 2\theta=A_0+B_1 r \sin \theta+A_2 (r^2 \cos^2 \theta - r^2 \sin^2 \theta) \quad (25)$$

$$\phi(x,y)=A_0+B_1 y+A_2(x^2-y^2) \quad (26)$$

The Fourier coefficients $A_0$, $B_1$, and $A_2$, as expressed in Equation 25 and Equation 26, may be calculated for the single-polarity hexapole electrostatic deflector 902 and expressed in Table 1:

TABLE 1

Fourier coefficients for a single-polarity hexapole electrostatic deflector 902

| | Expression with $\delta$ | Expression if $\delta \to 0$ (e.g. $\leq 2°$) |
|---|---|---|
| $A_0$ | $\frac{V}{2\pi}(\pi - \delta)$ | 0.50 V |
| $B_1$ | $\frac{1.7588\ V}{\pi R} \cos \frac{\delta}{2}$ | 0.56 V/R |
| $A_2$ | $-\frac{2.5321\ V}{\pi R^2} \sin \delta$ | ≈0.0 (e.g., −0.028 V/R² if $\delta = 2°$) |

As may be seen in Equation 25 and Equation 26 and Table 1, there exists a second-order term (e.g., $A_2$ term) for the electrostatic potential distribution for a single-polarity hexapole electrostatic deflector 902. It is further noted herein that the second-order term (e.g., $A_2$ term) is much smaller than the zeroth-order term (e.g., $A_0$ term) and first-order term (e.g., $B_1$ term). Furthermore, due to the fact that the gap angle $\delta$ is directly proportional to sin $\delta$, it is noted herein that the second-order term is negligible if the gap angle $\delta$ of the single-polarity hexapole electrostatic deflector 902 is designed to be relatively small (e.g., $\delta \leq 2°$).

A more detailed mathematical analysis of the single-polarity hexapole electrostatic deflector 902 is described by Xinrong Jiang in "Study of a single-polarity hexapole electrostatic deflector," published on Aug. 25, 2018, which is incorporated by reference in the entirety.

It is noted herein that portions of the mathematical analysis for the single-polarity hexapole electrostatic deflector 902 may be applied to other single-polarity electrostatic deflectors. For example, the octupole electrostatic deflector 104 illustrated in FIG. 2 may be operated as a single-polarity octupole electrostatic deflector 104 with applied deflection signals $V_y$ and $aV_y$ only (wherein $$a = \frac{\sqrt{2}}{2}).$$

For instance, a single-polarity octupole electrostatic deflector 104 may include a first deflection plate 108a with an applied deflection signal of $V_y$, a second deflection plate 108b and an eighth deflection plate 108h with applied voltages of $aV_y$, and third, fourth, fifth, sixth, and seventh deflection plates 108c, 108d, 108e, 108f, 108g with applied voltages of zero.

In this example, the electrostatic potential distribution for the single-polarity octupole electrostatic deflector 104 may be calculated similarly to that of the single-polarity hexapole electrostatic deflector 902. In this regard, the electrostatic potential distribution for the single-polarity octupole electrostatic deflector 104 may be described by Equation 25 and Equation 26. Similarly, the Fourier coefficients $A_0$, $B_1$, and $A_2$, as expressed in Equation 25 and Equation 26, may be calculated for the single-polarity octupole electrostatic deflector 104 and expressed in Table 2:

TABLE 2

Fourier coefficients for a single-polarity octupole electrostatic deflector 104

| | Expression with $\delta$ | Expression if $\delta \to 0$ (e.g. $\leq 2°$) |
|---|---|---|
| $A_0$ | $\frac{V}{2\pi}(\frac{\pi}{4} - \delta)(1 + 2a)$ | 0.302 V $\left(a = \frac{\sqrt{2}}{2}\right)$ |
| $B_1$ | $\frac{1.665\ V}{\pi R} \frac{\sin \delta}{\delta}$ | 0.53 V/R |
| $A_2$ | $\frac{0.707\ V}{\pi R^2} \cos(\pi - \delta)$ | −0.225 V/R² |

It is noted herein that the single-polarity hexapole electrostatic deflector 902 of the present disclosure offers a number of advantages over a single-polarity octupole electrostatic deflector 104. For example, comparing Table 1 and Table 2, where the single-polarity hexapole electrostatic deflector 902 has a negligible second-order term (e.g., $A_2$ term), the single-polarity octupole electrostatic deflector 104 has a non-negligible second-order term. The non-zero second-order term (e.g., $A_2$ term) causes the single-polarity octupole electrostatic deflector 104 to exhibit a transverse deflection field, rendering the electrostatic deflection performance to be insufficient for a multi-electron beam system (e.g., multi-electron beam apparatus 300). A comparison of the single-polarity hexapole electrostatic deflector 902 and the single-polarity octupole electrostatic deflector 104 may be further understood with reference to FIGS. 10A and 10B.

Figure 10A:
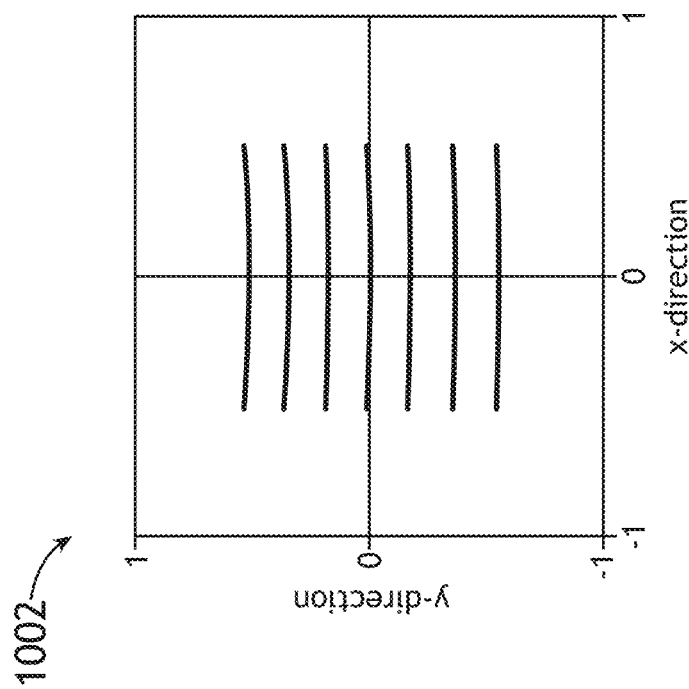
FIG. 10A depicts a graph illustrating equipotential lines of a single-polarity hexapole electrostatic deflector, in accordance with one or more embodiments of the present disclosure.
Figure 10B:
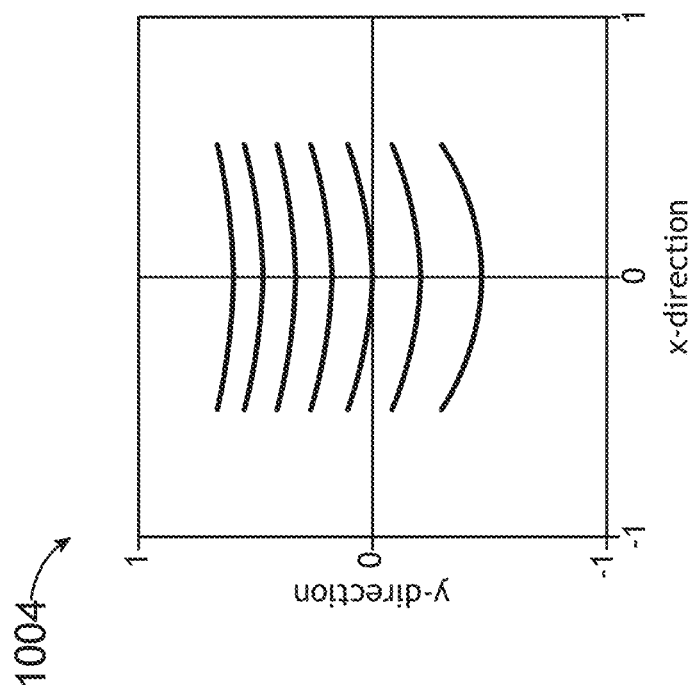
FIG. 10B depicts a graph illustrating illustrates equipotential lines of a single-polarity octupole electrostatic deflector, in accordance with one or more embodiments of the present disclosure.

FIG. 10A depicts a graph 1002 illustrating equipotential lines of a single-polarity hexapole electrostatic deflector 902, in accordance with one or more embodiments of the present disclosure. FIG. 10B depicts a graph 1004 illustrating equipotential lines of a single-polarity octupole electrostatic deflector 104, in accordance with one or more embodiments of the present disclosure. For the purposes of the graphs 1002, 1004 depicted in FIGS. 10A-10B, the radius of the deflectors may be assumed to be equal to one unit (e.g., R=1).

By comparing graph 1002 to graph 1004, it may be appreciated that the single-polarity hexapole electrostatic deflector 902 exhibits a substantially more uniform deflection distribution field than does the octupole electrostatic deflector 104. This may be said at least for an area which is half the deflector radius R. In addition to other reasons described herein, the non-uniform deflection distribution field of the single-polarity octupole electrostatic deflector 104 renders it incompatible for use with a multi-electron beam system (e.g., multi-electron beam apparatus 300). Furthermore, due to the fact that a single-polarity dodecapole electrostatic deflector 106 exhibits a similar deflection distribution field as that of the single-polarity octupole electrostatic deflector 104 (graph 1004), a single-polarity dodecapole electrostatic deflector 106 is likewise incompatible for use with a multi-electron beam system (e.g., multi-electron beam apparatus 300).

Figure 11:
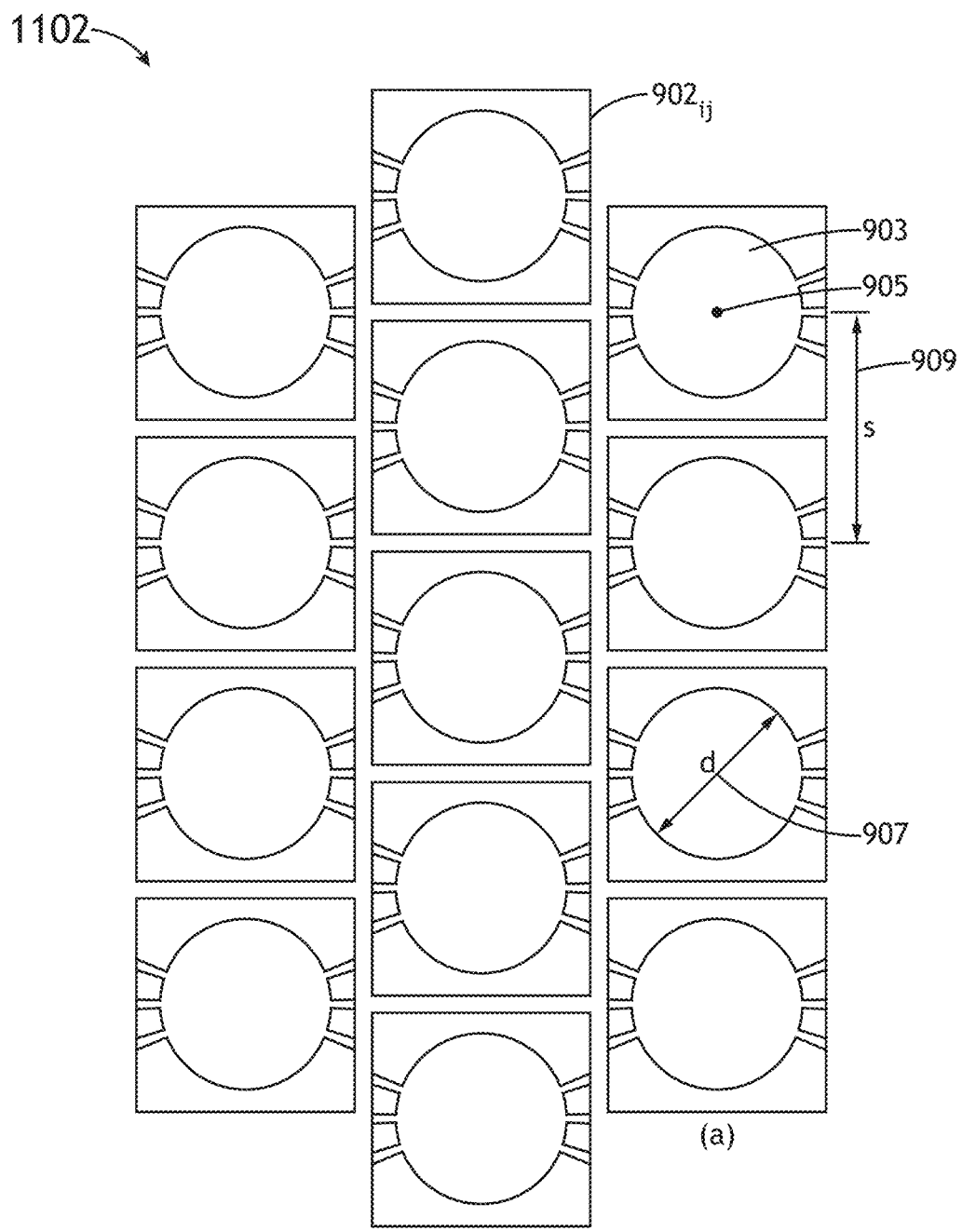
FIG. 11 illustrates a micro-deflection array (MDA) including single-polarity hexapole electrostatic deflectors, in accordance with one or more embodiments of the present disclosure.

FIG. 11 illustrates a micro-deflection array (MDA 1100) including single-polarity hexapole electrostatic deflectors 902$ij$, in accordance with one or more embodiments of the present disclosure.

It is noted herein that the MDA 1100 illustrated in FIG. 11 may be integrated into the MLA 308 as illustrated in FIG. 3. For example, the MDA 310 illustrated in FIG. 3 may comprise the MDA 1100 illustrated in FIG. 11. It is further noted herein, however, that the MDA 310 of the multi-electron beam apparatus 300 in FIG. 3 is not limited to the configuration of the MDA 1100 in FIG. 11, in that additional and/or alternative configurations may be used without departing from the spirit or scope of the present disclosure.

In one embodiment, MDA 1100 includes multiple single-polarity hexapole electrostatic deflectors 902$ij$. The subscripts i and j may be used to denote the arrangement and location of the respective single-polarity hexapole electrostatic deflectors 902$ij$, as described previously herein with respect to FIGS. 5-6. Accordingly, a single-polarity hexapole electrostatic deflectors 902 at position (i, j) may be referred to as single-polarity hexapole electrostatic deflectors 902$ij$.

The MDA 1102 illustrated in FIG. 11 may be integrated and micro-fabricated into the MLA 308 illustrated in FIG. 3 using any semiconductor process known in the art. In one embodiment, the MDA 1102 is fabricated onto an insulator substrate to facilitate the arrangement of voltage connecting lines and the fixation of the deflection plates 904$a$-904$f$. This may be further understood with reference to FIGS. 12A-12B.

In an additional and/or alternative embodiment, MDA 1102 illustrated in FIG. 11 may be incorporated and/or integrated into the first electrode 402 and/or the second electrode 406, as illustrated in FIG. 4. In this embodiment, it is contemplated herein that the $V_{fij}$ term in Equation 27 may be adjusted accordingly, wherein incorporating MLA 308 into the first electrode 402 results in Equation 28, and incorporating MDA 1102 into the second electrode 406 results in Equation 29, respectively:

$$V_{dij}=V_{1ij}+\Delta V_{dij} \quad (28)$$

$$V_{dij}=V_{2ij}+\Delta V_{dij} \quad (29)$$

As noted previously herein, the single-polarity electrostatic deflectors 902$ij$ of MDA 1102 may be used for scanning primary electron beamlets 305 in the y-direction. It is contemplated herein that rotating the MDA 1102 90° may result in an MDA 1102 which is configured to scan primary electron beamlets 305 in the x-direction. In one embodiment, an y-direction scanning MDA$_y$ 1102 and an x-direction scanning MDA$_x$ 1102 may be integrated into at least two of the electrodes illustrated in FIG. 4 (e.g., first electrode 402, focusing electrode 404, second electrode 406). In this embodiment, a complete MLA$_{xy}$ 308 may be configured to scan primary electron beamlets 305 over field of views in both the x-direction and y-direction individually and simultaneously.

Figure 12A:
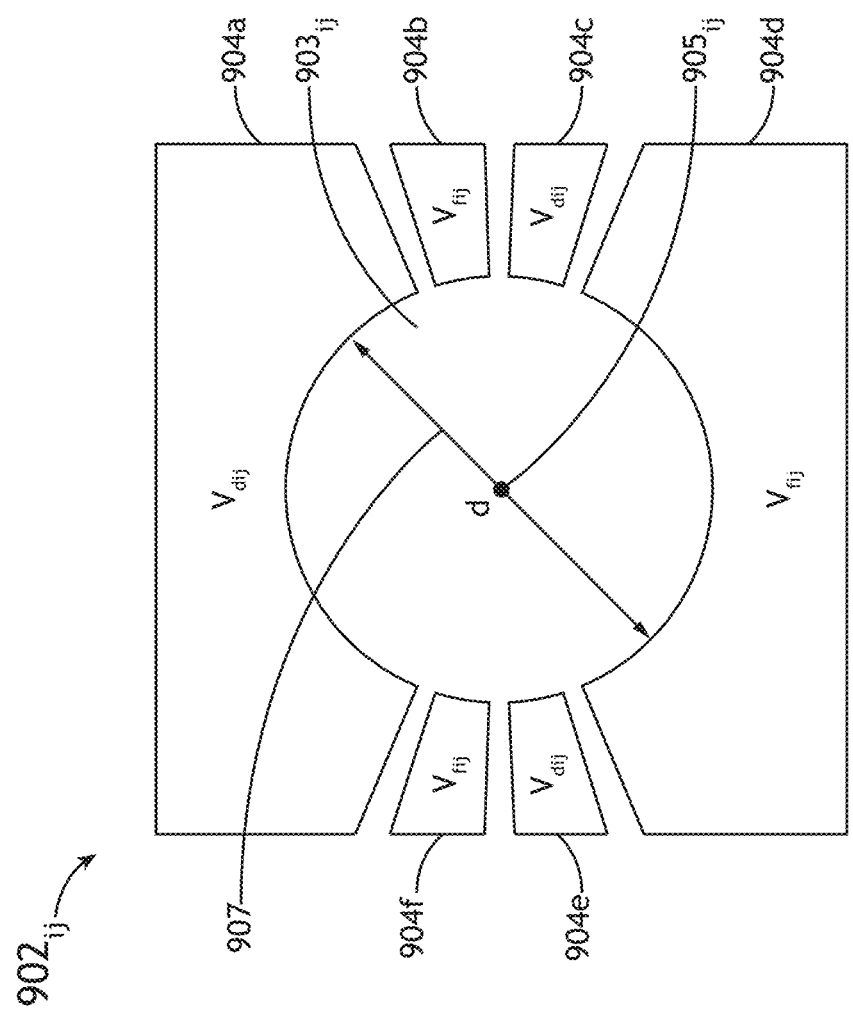
FIG. 12A illustrates a single-polarity electrostatic deflector of the micro-deflection array (MDA) illustrated in FIG. 11, in accordance with one or more embodiments of the present disclosure.

FIG. 12A illustrates a single-polarity electrostatic deflector 902$ij$ of the micro-deflection array (MDA 1102) illustrated in FIG. 11, in accordance with one or more embodiments of the present disclosure. In one embodiment, the single-polarity hexapole electrostatic deflector 902$ij$ include a bore 903$ij$ with bore size d (e.g., bore diameter d). Each bore 903$ij$ may be circular or substantially circular in shape. For example, each bore 903$ij$ may be circular with a center 905$ij$ and a diameter d 907.

In one embodiment, the deflection signal $V_{dij}$ for the single-polarity hexapole electrostatic deflectors 902$ij$ may be described by Equation 27:

$$V_{dij}=V_{fij}+\Delta V_{dij} \quad (27)$$

wherein $\Delta V_{dij}$ is the deflection signal voltage, $V_{fij}$ is the focusing voltage for the single-polarity hexapole electrostatic deflectors 902$ij$ at position (i, j) (e.g., Einzel lens at position (i, j)), and $\Delta V_{dij}$ is the scanning voltage for the single-polarity hexapole electrostatic deflectors 902$ij$ at position (i, j) (e.g., Einzel lens at position (i,j)).

Figure 12B:
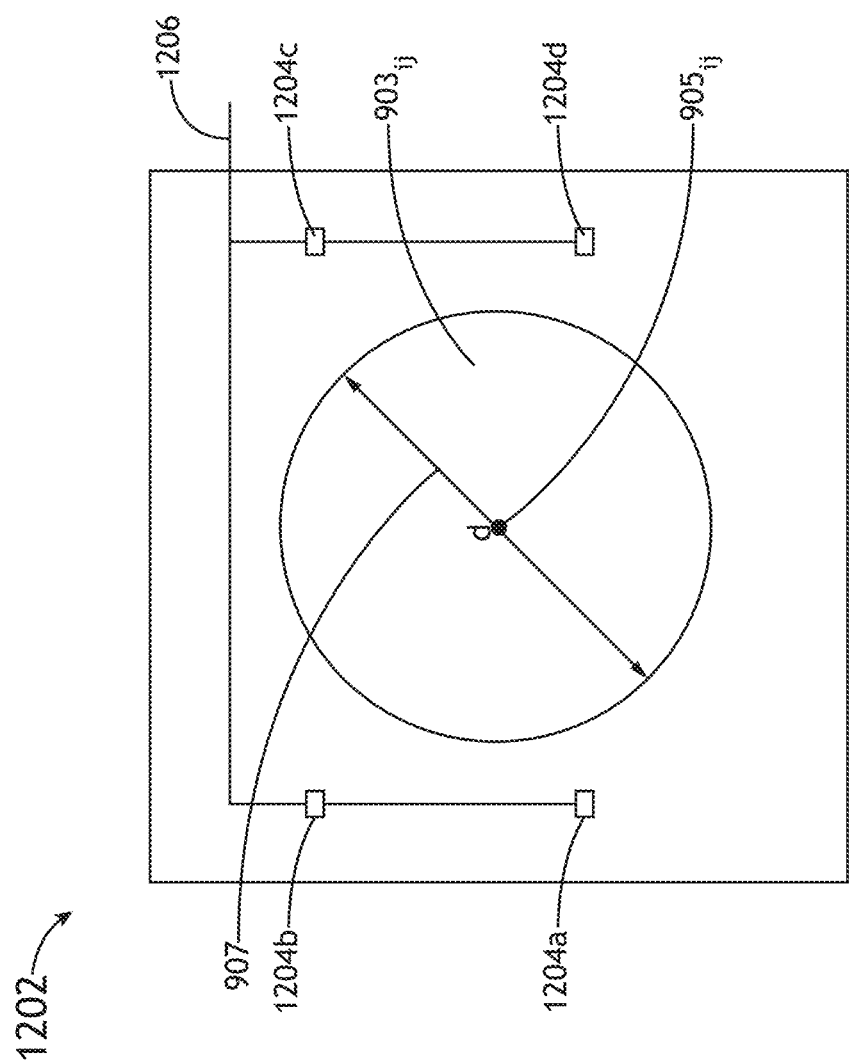
FIG. 12B illustrates an insulator substrate of the single-polarity electrostatic deflector illustrated in FIG. 12A, in accordance with one or more embodiments of the present disclosure.

FIG. 12B illustrates an insulator substrate 1202 of the single-polarity hexapole electrostatic deflector 902$ij$, in accordance with one or more embodiments of the present disclosure. The insulator substrate 1202 may include, but is not limited to including, one or more connecting pins 1204 and one or more voltage connecting lines 1206.

It is contemplated herein single-polarity hexapole electrostatic deflector 902$ij$ may be planted on the insulator substrate 1202 in order to integrate the MDA 1100 into the MLA 308. As noted previously, single-polarity hexapole electrostatic deflectors 902$ij$ of the MDA 1102 may be integrated and micro-fabricated into the MLA 308 in order to facilitate the arrangement of voltage connecting lines 1206 and the fixation of the deflection plates 904$a$-904$f$.

In one embodiment, the applied focusing voltage may be equal, such that $V_{fij}=V$. For example, referring to the single-polarity hexapole electrostatic deflector 902$ij$ in FIG. 12A, the second deflection plate 904$b$, the fourth deflection plate 904$d$, and the sixth deflection plate 904$f$ may exhibit the same applied focusing voltage $V_f$. In an additional and/or alternative embodiment, each of the deflection plates 904 with the same applied focusing voltage may be fabricated as a single plate electrode. For instance, continuing with the same example, the second deflection plate 904$b$, the fourth deflection plate 904$d$, and the sixth deflection plate 904$f$ may be fabricated as a single plate electrode.

In embodiments where multiple deflection plates 904 are fabricated as a single plate electrode, the number of connecting pins 1204 required in the insulator substrate 1202 may be minimized. For example, in embodiments where the second deflection plate 904$b$, the fourth deflection plate 904$d$, and the sixth deflection plate 904$f$ are fabricated as a single plate electrode, the single plate electrode may be coupled to a single connecting pin 1204, wherein the remaining three deflection plates 904 may be each coupled to a separate connecting pin 1204. For instance, if the second deflection plate 904$b$, the fourth deflection plate 904$d$, and the sixth deflection plate 904$f$ are fabricated as a single plate electrode, the single plate electrode may be coupled to a single connecting pin 1204$d$, the first deflection plate 904$a$ may be coupled to a connecting pin 1204$a$, the third deflection plate 904$c$ may be coupled to a connecting pin 1204$b$, and the fifth deflection plate 904$e$ may be coupled to a connecting pin 1204$c$.

Figure 13:
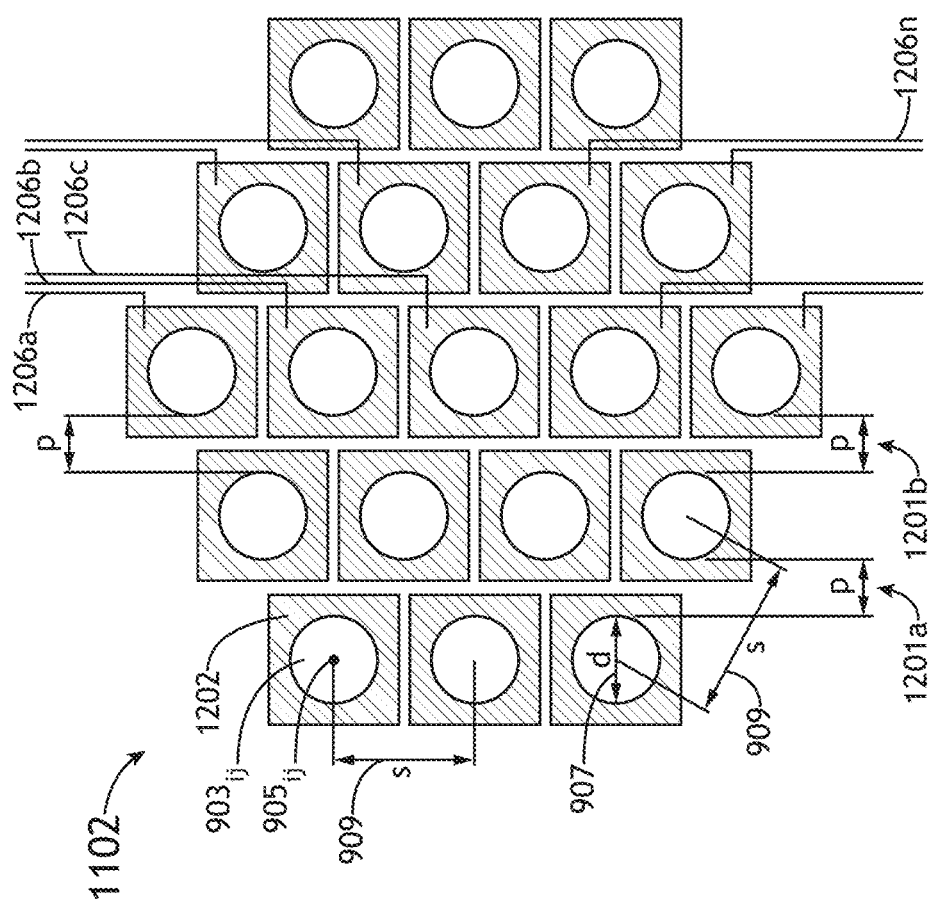
FIG. 13 illustrates a micro-deflection array (MDA) with an insulator substrate for holding and powering the MDA, in accordance with one or more embodiments of the present disclosure.

FIG. 13 illustrates a micro-deflection array (MDA 1102) with an insulator substrate 1202 for holding and powering the MDA 1102, in accordance with one or more embodiments of the present disclosure. As shown in FIG. 11, the MDA 1102 may include multiple single-polarity hexapole electrostatic deflectors 902$ij$ disposed on an insulator substrate 1202.

In one embodiment, the MDA 1102 includes one or more voltage connecting lines 1206a, 1206b, 1206c, 1206n disposed on the insulator substrate 1202. In another embodiment, the one or more voltage connecting lines 1206 may be configured to electrically couple the one or more single-polarity hexapole electrostatic deflectors 902 to one or more voltage sources. As noted previously herein, a single-polarity hexapole electrostatic deflector 902 may provide geometric/spatial advantages over other electrostatic deflectors in that the single-polarity hexapole electrostatic deflector 902 may require only a single voltage connecting line 1206. For example, in an MDA 1102 with $MB_{tot}$ number of single-polarity hexapole electrostatic deflectors 902 (as defined in Equation 13), the MDA 1102 may include $MB_{tot}$ number of voltage connecting lines 1206.

In one embodiment, each single-polarity hexapole electrostatic deflector 902$ij$ may include a bore 903$ij$ with bore size d (e.g., bore diameter d). Each bore 903$ij$ may be circular or substantially circular in shape. For example, each bore 903$ij$ may be circular with a center 905$ij$ and a diameter d. In another embodiment, the single-polarity hexapole electrostatic deflectors 902$ij$ are arranged such that the center 905$ij$ of each bore 903$ij$ is separated by a spacing distance (s) 909, wherein the spacing distance 909 is defined as the distance between the centers 905$ij$ of adjacent bores 903$ij$. In another embodiment, the single-polarity hexapole electrostatic deflectors 902$ij$ are arranged such that the edges of the bores 903$ij$ are separated by an edge-to-edge bore distance p. It is noted herein that the arrangement and configuration of the single-polarity hexapole electrostatic deflectors 902 may create channels 1201a, 1201b, 1201n between the bores 903$ij$ of each single-polarity hexapole electrostatic deflectors 902, wherein the channels 1201 are defined by a width p. In one embodiment, the voltage connecting lines 1206 of the MDA 1102 are arranged within the channels 1201 so as not to decrease the optical performance of the single-polarity hexapole electrostatic deflectors 902$ij$.

As noted previously herein, the reduction in the number of voltage connecting lines 1206 may be desirable in that a reduction of voltage connecting lines 1206 may alleviate spatial constraints of an MDA 1102. In this regard, decreasing the number of voltage connecting lines 1202 may allow for an increased deflector density within an MDA 1102. Furthermore, increasing the deflector density (e.g., single-polarity hexapole electrostatic deflector 902$ij$ density, and the like), may provide increased optical performance and allow an optical system (e.g., multi-electron beam apparatus 300) to utilize hundreds up to thousands of primary electron beamlets 305.

An example may prove to be illustrative. In this example, reference will be made to the hexagonal configuration illustrated in FIG. 13. Suppose each bore 903$_{ij}$ has a bore size of 50 μm (e.g., d=50 μm), the spacing between each bore 903$_{ij}$ is 80 μm (e.g., s=80 μm), and the edge-to-edge bore distance is 19 μm (e.g., p=19 μm). The voltage connecting lines 1206 may be arranged within the channels 1201. In this example, further assume that there are 21 single-polarity hexapole electrostatic deflectors 902$_{ij}$ along the central column of the MDA 1102 (e.g., $M_c$=21), giving 331 total single-polarity hexapole electrostatic deflectors 902$_{ij}$ according to Equation 13 (e.g., $MB_{tot}$=331). In this example, in order to obtain 331 total primary electron beamlets 305 (one beamlet for each single-polarity hexapole electrostatic deflectors 902$_{ij}$, the diameter of the primary electron beam 303 between the gun lens 304 and the aperture 306 in FIG. 3 would be around 2 mm.

Continuing with the same example, the highest density of voltage connecting lines 1206 would be in the channel 1201 between the central column and adjacent columns. In this example, due to the fact that there are 21 single-polarity hexapole electrostatic deflectors 902$_{ij}$ along the central column of the MDA 1102 (e.g., $\Delta n_c$=21), there would be 11 voltage connecting lines 1206 which run "upwards" in the +y direction, and 10 voltage connecting lines 1206 which run "downwards" in the −y direction. As noted previously, the channel 1201 within which these lines run is 19 μm (e.g., p=19 μm) in this example. Assuming the width of each voltage connecting line 1206 is 1 μm, this would allow the 11 voltage connecting lines 1206 to run within the channel 1201 with a spacing of 0.8 μm between each voltage connecting line 1206.

In this example, the tight spacing of the voltage connecting lines 1206 within the channels 1201 illustrates the importance of geometric constraints in fabricating an MLA 308 and/or MDA 310, 1102. In particular, the spacing of connecting lines 1206 in this example illustrates the importance of minimizing the number of voltage connecting lines 1206 required for each individual electrostatic deflector (e.g., single-polarity hexapole electrostatic deflector 902, and the like). In particular, minimizing the number of voltage connecting lines 1206 required for each electrostatic deflector may increase the integration density of electrostatic deflectors within MDA 1102, 310. For example, maximum deflector integration numbers for various types of deflectors may be illustrated in Table 3:

TABLE 3

Maximum deflector integration number per MDA

| Deflector Type | Plate # | Connecting Line # | Max integrated deflector/MDA |
| --- | --- | --- | --- |
| Dual-polarity octupole | 8 | 4 | 19 |
| Dual-polarity dodecapole | 12 | 2 | 91 |
| Dual-polarity hexapole | 6 | 2 | 91 |
| Single-polarity hexapole | 6 | 1 | 331 |

Specifically, Table 3 illustrates the maximum number of deflectors which may be integrated into a MDA 1102, 310 based on the number of voltage connecting lines 1206 required for each type of deflector. For purposes of comparison, Table 3 is produced assuming deflectors of the same radius R, uniform widths and spacings of voltage connecting lines 1206, and uniform edge-to-edge bore distance p (e.g., uniform channel 1201 width). As may be seen in Table 3, an MDA 1102 fabricated with single-polarity hexapole electrostatic deflectors 902 may exhibit the highest deflector density. This is largely due to the low number of voltage connecting lines 1206 required for each the single-polarity hexapole electrostatic deflector 902. Additionally, it is contemplated herein that the improved deflector density provided by MDAs 1102 produced with single-polarity hexapole electrostatic deflectors 902 may allow such MDAs 1102 to provide increased optical performance and allow an optical system (e.g., multi-electron beam apparatus 300) to utilize hundreds up to thousands of primary electron beamlets 305.

It is contemplated herein that an MDA 1102, 310 with individual electrostatic deflectors (e.g., single-polarity hexapole electrostatic deflector 902, and the like) may provide for independent positioning and alignment of individual primary electron beamlets 305. Furthermore, it is contemplated herein that adjusting the applied voltages for each of the electrostatic deflectors may provide for individual and independent electron beamlet 305 distortion correction and/or electron beamlet 305 positioning error correction.

Figure 14:
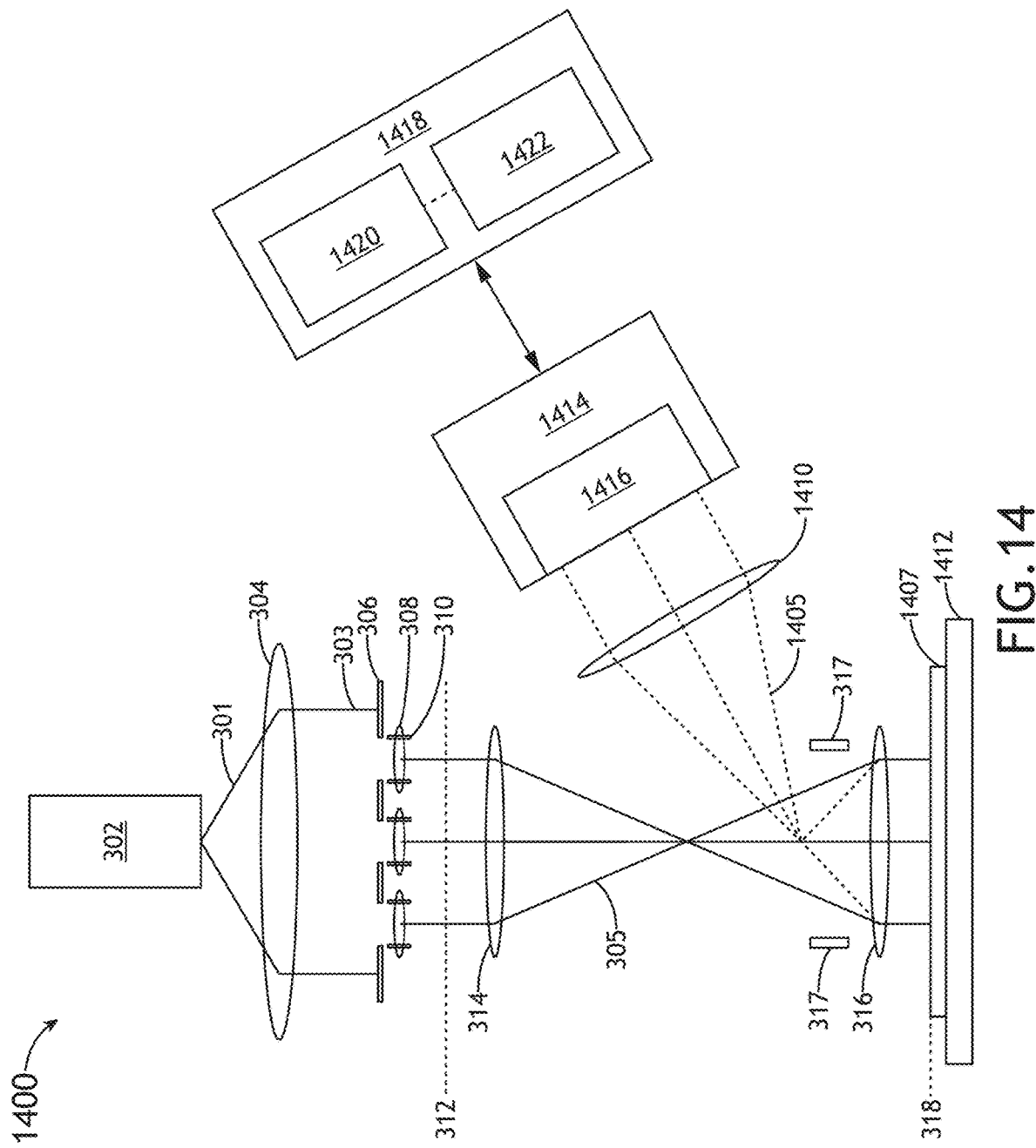
FIG. 14 illustrates a simplified schematic diagram of an optical characterization system, in accordance with one or more embodiments of the present disclosure.

FIG. 14 illustrates a simplified schematic diagram of an optical characterization system 1400, in accordance with one or more embodiments of the present disclosure. The optical characterization system 1400 may include any characterization system known in the art including, but not limited to, an inspection system, a review system, an image-based metrology system, and the like. In this regard, system 1400 may be configured to perform inspection, review, or image-based metrology on a sample 1407. The optical characterization system 1400 may include, but is not limited to, multi-electron beam apparatus 300, a sample 1407 disposed on a sample stage 1412, a detector assembly 1414, and a controller 1418 including one or more processors 1420 and a memory 1422.

In one embodiment, the electron beam apparatus 300 of system 1400 is configured to direct the primary electron beamlets 305 to the sample 1407. The multi-electron beam apparatus 300 may form an electron-optical column. In another embodiment, multi-electron beam apparatus 300 includes one or more additional and/or alternative electron-optical elements configured to focus and/or direct the primary electron beamlets 305 to the surface of the sample 1407. In another embodiment, system 1400 includes one or more electron-optical elements 1410 configured to collect secondary electrons 1405 emanated from the surface of the sample 1407 in response to the primary electron beamlets 305. It is noted herein that the one or more electron-optical elements of multi-electron beam apparatus 300 and the one or more electron-optical elements 1410 may include any electron-optical elements configured to direct, focus, and/or collect electrons including, but not limited to, one or more deflectors, one or more electron-optical lenses, one or more condenser lenses (e.g., magnetic condenser lenses), one or more objective lenses (e.g., magnetic condenser lenses), and the like.

Sample 1407 may include any sample known in the art including, but not limited to, a wafer, a reticle, a photomask, and the like. In one embodiment, sample 1407 is disposed on a stage assembly 1412 to facilitate movement of sample 1407. In another embodiment, the stage assembly 1412 is an actuatable stage. For example, the stage assembly 1412 may include, but is not limited to, one or more translational stages suitable for selectably translating the sample 1407 along one or more linear directions (e.g., x-direction, y-direction and/or z-direction). By way of another example, the stage assembly 1412 may include, but is not limited to, one or more rotational stages suitable for selectively rotating the sample 1407 along a rotational direction. By way of another example, the stage assembly 1412 may include, but is not limited to, a rotational stage and a translational stage suitable for selectably translating the sample 1407 along a linear direction and/or rotating the sample 1407 along a rotational direction. It is noted herein that the system 1400 may operate in any scanning mode known in the art.

It is noted that the electron optical assembly of the multi-electron beam apparatus 300 and/or system 1400 is not limited to the electron-optical elements depicted in FIG. 14, which are provided merely for illustrative purposes. It is further noted that the system 1400 may include any number and type of electron-optical elements necessary to direct/focus the primary electron beamlets 305 onto the sample 1407 and, in response, collect and image the emanated secondary electrons 1405 onto the detector assembly 1414.

For example, the system 1400 may include one or more electron beam scanning elements (not shown). For instance, the one or more electron beam scanning elements may include, but are not limited to, one or more electromagnetic scanning coils or electrostatic deflectors suitable for controlling a position of the primary electron beamlets 305 relative to the surface of the sample 1407. Further, the one or more scanning elements may be utilized to scan the primary electron beamlets 305 across the sample 1407 in a selected pattern.

In another embodiment, secondary electrons 1405 are directed by deflectors 317 to one or more sensors 1416 of a detector assembly 1414. The deflectors 317 may include any optical elements known in the art for directing secondary electrons 1405 including, but not limited to, Wien filters. The detector assembly 1414 of the system 1400 may include any detector assembly known in the art suitable for detecting multiple secondary electrons 1405 from the surface of the sample 1407. In one embodiment, the detector assembly 1414 includes an electron detector array. In this regard, the detector assembly 1414 may include an array of electron-detecting portions. Further, each electron-detecting portion of the detector array of the detector assembly 1414 may be positioned so as to detect an electron signal from sample 1407 associated with one of the incident primary electron beamlets 305. In this regard, each channel of the detector assembly 1414 may correspond to a particular primary electron beamlet 305 of the multi-electron beam apparatus 300. The detector assembly 1414 may include any type of electron detector known in the art. For example, the detector assembly 1414 may include a micro-channel plate (MCP), a PIN or p-n junction detector array, such as, but not limited to, a diode array or avalanche photo diodes (APDs). By way of another example, the detector assembly 1414 may include a high speed scintillator/PMT detector.

While FIG. 14 illustrates the system 1400 as including a detector assembly 1414 comprising only a secondary electron detector assembly, this is not to be regarded as a limitation of the present disclosure. In this regard, it is noted that the detector assembly 1414 may include, but is not limited to, a secondary electron detector, a backscattered electron detector, and/or a primary electron detector (e.g., an in-column electron detector). In another embodiment, system 1400 may include a plurality of detector assemblies 1414. For example, system 1400 may include a secondary electron detector assembly 1414, a backscattered electron detector assembly 1414, and an in-column electron detector assembly 1414.

In another embodiment, detector assembly 1414 is communicatively coupled to a controller 1418 including one or more processors 1420 and memory 1422. For example, the one or more processors 1420 may be communicatively coupled to memory 1422, wherein the one or more processors 1420 are configured to execute a set of program instructions stored on memory 1422. In one embodiment, the one or more processors 1420 are configured to analyze the output of detector assembly 1414. In one embodiment, the set of program instructions are configured to cause the one or more processors 1420 to analyze one or more characteristics of sample 1407. In another embodiment, the set of program instructions are configured to cause the one or more processors 1420 to modify one or more characteristics of system 1400 in order to maintain focus on the sample 1407 and/or the sensor 1416. For example, the one or more processors 1420 may be configured to adjust one or more characteristics of the multi-electron beam apparatus 300, objective lens 1406, or one or more optical elements 1402 in order to focus primary electron beamlets 305 from multi-electron beam apparatus 300 onto the surface of the sample 1407. By way of another example, the one or more processors 1420 may be configured to adjust the objective lens 706 and/or one or more optical elements 1410 in order to collect secondary electrons 1405 from the surface of the sample 1407 and focus the collected secondary electrons 1405 on the sensor 1416. By way of another example, the one or more processors 1420 may be configured to adjust one or more focusing voltages applied to one or more electrostatic deflectors of multi-electron beam apparatus 300 in order to independently adjust the position or alignment of one or more primary electron beamlets 305.

It is noted herein that the one or more components of system 1400 may be communicatively coupled to the various other components of system 1400 in any manner known in the art. For example, the one or more processors 1420 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like). By way of another example, the one or more processors may be communicatively coupled to one or more components of the multi-electron beam apparatus 300 (e.g., electron source 302, MLA 308, MDA 310, and the like), the one or more voltage sources, and the like In one embodiment, the one or more processors 1420 may include any one or more processing elements known in the art. In this sense, the one or more processors 1420 may include any microprocessor-type device configured to execute software algorithms and/or instructions. In one embodiment, the one or more processors 1420 may consist of a desktop computer, mainframe computer system, workstation, image computer, parallel processor, or other computer system (e.g., networked computer) configured to execute a program configured to operate the system 1400, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 1420. In general, the term "processor" may be broadly defined to encompass any device having one or more processing elements, which execute program instructions from memory 1422. Moreover, different subsystems of the system 1400 (e.g., multi-electron beam apparatus 300, MLA 308, MDA 310, detector assembly 1414, controller 1418, and the like) may include processor or logic elements suitable for carrying out at least a portion of the steps described throughout the present disclosure. Therefore, the above description should not be interpreted as a limitation on the present disclosure but merely an illustration.

The memory 1422 may include any storage medium known in the art suitable for storing program instructions executable by the associated one or more processors 1420. For example, the memory 1422 may include a non-transitory memory medium. For instance, the memory 1422 may include, but is not limited to, a read-only memory (ROM), a random access memory (RAM), a magnetic or optical memory device (e.g., disk), a magnetic tape, a solid state drive and the like. It is further noted that memory 1422 may be housed in a common controller housing with the one or more processors 1420. In an alternative embodiment, the memory 1422 may be located remotely with respect to the physical location of the processors 1420, controller 1418, and the like. In another embodiment, the memory 1422 maintains program instructions for causing the one or more processors 1420 to carry out the various steps described through the present disclosure.

Figure 15:
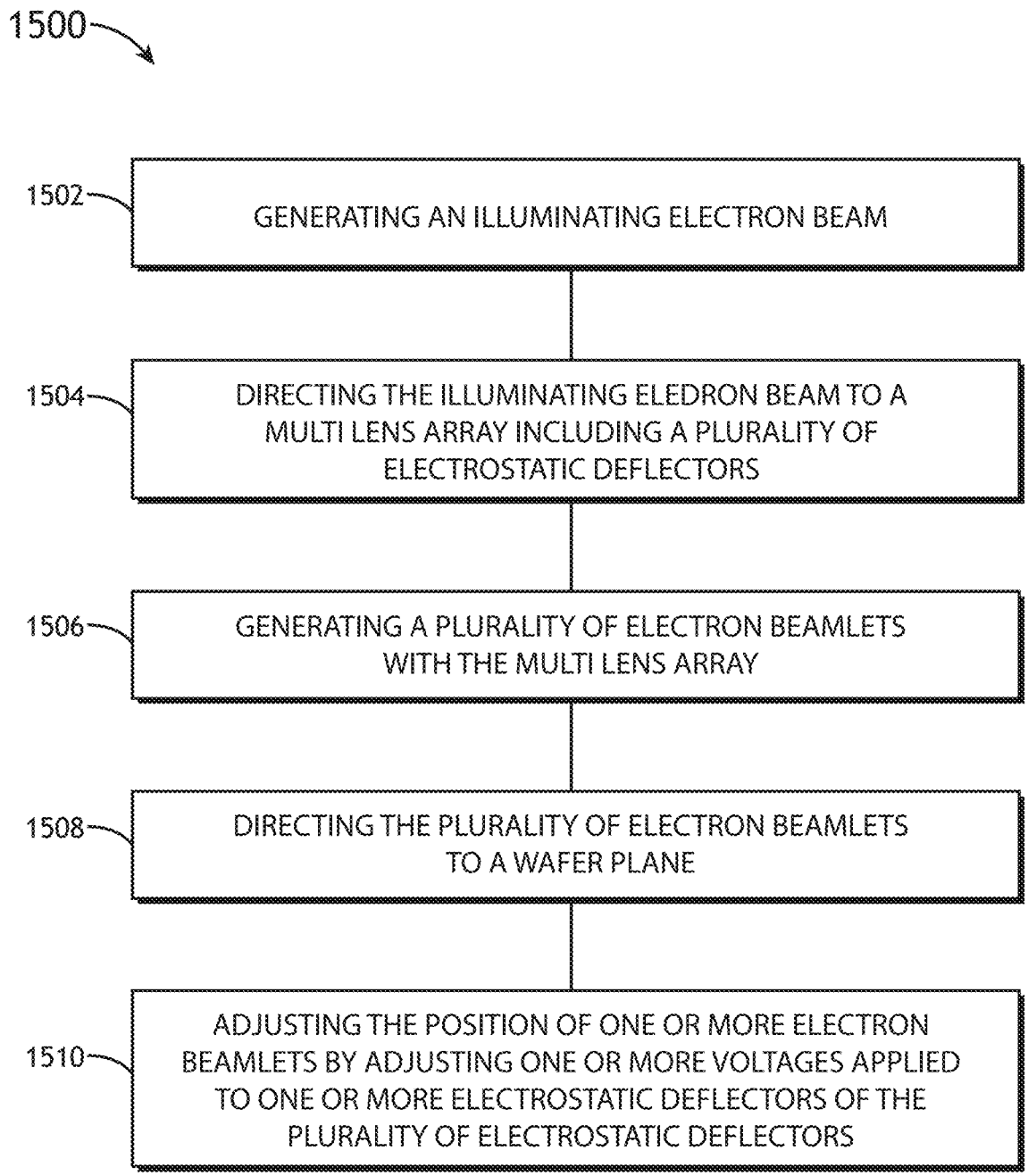
FIG. 15 illustrates a flowchart of a method of inspection using a multi lens array, in accordance with one or more embodiments of the present disclosure.

FIG. 15 illustrates a flowchart of a method 1500 of inspection using a multi lens array, in accordance with one or more embodiments of the present disclosure. It is noted herein that the steps of method 1500 may be implemented all or in part by system 1400 and/or multi-electron beam apparatus 300. It is further recognized, however, that the method 1500 is not limited to the system 1400 and/or multi-electron beam apparatus 300 in that additional or alternative system-level embodiments may carry out all or part of the steps of method 1500.

In a step 1502, a primary electron beam is generated. For example, an electron source 302 may generate a primary electron beam 303. The electron source 302 may include any electron source known in the art including, but not limited to, thermal field emission (TFE) sources.

In a step 1504, the primary electron beam is directed to a multi lens array (MLA) including a plurality of electrostatic deflectors. For example, the gun lens 304 may be configured to direct the primary electron beam 303 to an aperture 306 and a micro-lens array 308 (e.g., MLA 308). The MLA 308 may include an integrated micro-deflection array 310 (e.g., MDA 310). In one embodiment, the MDA 310 may include hundreds of micro electrostatic deflectors. The micro electrostatic deflectors may include any micro electrostatic deflectors known in the art including, but not limited to, dual-polarity hexapole electrostatic deflectors, single-polarity hexapole electrostatic deflectors, and the like.

In a step 1506, a plurality of primary electron beamlets are generated with the multi lens array. For example, the MLA 308 and MDA 310 may be configured to receive one or more primary electron beams and split the one or more primary electron beams 303 intro multiple primary electron beamlets 305.

In a step 1508, the plurality of primary electron beamlets are directed to a wafer plane. For example, projection optics of the multi-electron beam apparatus 300 may be configured to direct primary electron beamlets 305 to a wafer plane 318. The projection optics may include, but are not limited to, a transfer lens 314 and an objective lens 316.

In a step 1510, the position of one or more primary electron beamlets is adjusted by adjusting one or more voltages applied to one or more electrostatic deflectors of the plurality of electrostatic deflectors.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
    an electron source;
    a micro-lens array (MLA) configured to receive one or more primary electron beams from the electron source, the micro-lens array including a micro-deflection array (MDA) comprising a plurality of hexapole electrostatic deflectors configured to eliminate third-order deflection aberrations, wherein the micro-deflection array is configured to split the one or more primary electron beams into a plurality of primary electron beamlets; and
    projection optics configured to receive the plurality of primary electron beamlets and focus the plurality of primary electron beamlets onto a surface of a sample.

2. The system of claim 1, wherein the micro-deflection array comprises:
    an insulator substrate;
    a plurality of hexapole electrostatic deflectors disposed on the insulator substrate, wherein each hexapole electrostatic deflector of the plurality of hexapole electrostatic deflectors comprises six deflection plates; and
    a plurality of voltage connecting lines disposed on the insulator substrate configured to electrically couple the plurality of hexapole electrostatic deflectors to one or more voltage sources via a plurality of connecting pins, wherein the one or more voltage sources are configured to apply one or more focusing voltages to each hexapole electrostatic deflector of the plurality of hexapole electrostatic deflectors.

3. The system of claim 1, further comprising a controller including one or more processors and a memory, wherein the one or more processors are configured to adjust the one or more focusing voltages applied to each hexapole electrostatic deflector of the plurality of hexapole electrostatic deflectors.

4. The system of claim 3, wherein the one or more processors are further configured to adjust the one or more focusing voltages in order to individually adjust the position of each primary electron beamlet of the plurality of primary electron beamlets at the sample plane.

5. The system of claim 1, further comprising an aperture configured to receive the primary electron beam from the electron source and direct the primary electron beam to the multi lens array (MLA).

6. The system of claim 1, wherein the projection optics comprise a transfer lens and an objective lens.

7. The system of claim 1, wherein the electron source comprises a thermal field emission (TFE) source.

8. The system of claim 1, wherein the plurality of hexapole electrostatic deflectors comprise a plurality of dual-polarity hexapole electrostatic deflectors.

9. The system of claim 1, wherein the plurality of hexapole electrostatic deflectors comprise a plurality of single-polarity hexapole electrostatic deflectors.

10. The system of claim 1, wherein the plurality of hexapole electrostatic deflectors are arranged in a hexagonal configuration.

11. The system of claim 10, wherein the number of hexapole electrostatic deflectors along a central column of the hexagonal configuration is defined by the term $M_c$ such that the total number of hexapole electrostatic deflectors $MB_{tot}$ in the micro-deflection array is defined by $$MB_{tot} = \frac{1}{4}(1 + 3M_C^2).$$

12. The system of claim 1,
    wherein a first deflection plate, a third deflection plate, and a fifth deflection plate of each hexapole electrostatic deflector of the plurality of hexapole electrostatic deflectors are applied with a first focusing voltage, and
    wherein a second deflection plate, a fourth deflection plate, and a sixth deflection plate of each hexapole electrostatic deflector of the plurality of hexapole electrostatic deflectors are applied with a second focusing voltage.

13. The system of claim 1,
    wherein each deflection plate of the six deflection plates are separated by a gap angle $\delta$, and
    wherein a second deflection plate, a third deflection plate, a fifth deflection plate, and a sixth deflection plate are defined by a plate angle $\beta$, such that $\beta+\delta=20°$.

14. The system of claim 1, wherein each hexapole electrostatic deflector of the plurality of hexapole electrostatic deflectors is coupled to the one or more voltage sources with a single voltage connecting line.

15. The system of claim 1, wherein each hexapole electrostatic deflector of the plurality of hexapole electrostatic deflectors comprises a micro Einzel lens.

16. A micro-deflection array, comprising:
    an insulator substrate;
    a plurality of hexapole electrostatic deflectors disposed on the insulator substrate, wherein each hexapole electrostatic deflector of the plurality of hexapole electrostatic deflectors comprises six deflection plates configured to eliminate third-order deflection aberrations; and
    a plurality of voltage connecting lines disposed on the insulator substrate configured to electrically couple the plurality of hexapole electrostatic deflectors to one or more voltage sources via a plurality of connecting pins, wherein the one or more voltage sources are configured to apply one or more focusing voltages to each hexapole electrostatic deflector of the plurality of hexapole electrostatic deflectors.

17. The micro-deflection array of claim 16, wherein the micro-deflection array is configured to receive one or more primary electron beams from an electron source and split the one or more primary electron beams into a plurality of primary electron beam lets.

18. The micro-deflection array of claim 17, wherein the micro-deflection array is configured to individually adjust the position of each primary electron beam let of the plurality of primary electron beam lets.

19. The micro-deflection array of claim 16, wherein the plurality of hexapole electrostatic deflectors comprise a plurality of dual-polarity hexapole electrostatic deflectors.

20. The micro-deflection array of claim 16, wherein the plurality of hexapole electrostatic deflectors comprise a plurality of single-polarity hexapole electrostatic deflectors.

21. The micro-deflection array of claim 16, wherein the plurality of hexapole electrostatic deflectors are arranged in a hexagonal configuration.

22. The micro-deflection array of claim 21, wherein the number of hexapole electrostatic deflectors along a central column of the hexagonal configuration is defined by the term $M_c$ such that the total number of hexapole electrostatic deflectors $MB_{tot}$ in the micro-deflection array is defined by $$MB_{tot} = \frac{1}{4}(1 + 3M_c^2).$$

23. The micro-deflection array of claim 16,
wherein a first deflection plate, a third deflection plate, and a fifth deflection plate of each hexapole electrostatic deflector of the plurality of hexapole electrostatic deflectors are applied with a first focusing voltage, and
wherein a second deflection plate, a fourth deflection plate, and a sixth deflection plate of each hexapole electrostatic deflector of the plurality of hexapole electrostatic deflectors are applied with a second focusing voltage.

24. The micro-deflection array of claim 16,
wherein each deflection plate of the six deflection plates are separated by a gap angle δ, and
wherein a second deflection plate, a third deflection plate, a fifth deflection plate, and a sixth deflection plate are defined by a plate angle β, such that β+δ=20°.

25. The micro-deflection array of claim 16, wherein each hexapole electrostatic deflector of the plurality of hexapole electrostatic deflectors is coupled to the one or more voltage sources with a single voltage connecting line.

26. The micro-deflection array of claim 16, wherein each hexapole electrostatic deflector of the plurality of hexapole electrostatic deflectors comprises a micro Einzel lens.

27. A hexapole electrostatic deflector, comprising:
six deflection plates configured to eliminate third-order deflection aberrations, the six deflection plates arranged about a radius R, the six deflection plates comprising a first deflection plate, a second deflection plate, a third deflection plate, a fourth deflection plate, a fifth deflection plate, and a sixth deflection plate;
wherein the first deflection plate, the third deflection plate, and the fifth deflection plate are applied with a first focusing voltage, and wherein the second deflection plate, the fourth deflection plate, and the sixth deflection plate are applied with a second focusing voltage.

28. The hexapole electrostatic deflector of claim 27, wherein the hexapole electrostatic deflector comprises a single-polarity electrostatic deflector.

29. The hexapole electrostatic deflector of claim 27, wherein the hexapole electrostatic deflector comprises a dual-polarity electrostatic deflector.

30. The hexapole electrostatic deflector of claim 27, wherein the first focusing voltage comprises +1V and the second focusing voltage comprises −1V.

31. The hexapole electrostatic deflector of claim 27, wherein the second focusing voltage comprises 0V.

32. The hexapole electrostatic deflector of claim 27, further comprising an insulator substrate, wherein the six deflection plates are disposed on the insulator substrate.

33. The hexapole electrostatic deflector of claim 27, wherein the second deflection plate, the third deflection plate, the fifth deflection plate, and the sixth deflection plate are defined by a plate angle β.

34. The hexapole electrostatic deflector of claim 33, wherein each of the six deflection plates are separated by a gap angle δ, wherein β+δ=20°.

35. The hexapole electrostatic deflector of claim 27, further comprising one or more voltage connecting lines configured to electrically couple three or more deflection plates of the six deflection plates to one or more voltage sources.

36. The hexapole electrostatic deflector of claim 27, wherein the hexapole electrostatic deflector comprises a micro Einzel lens.

* * * * *